US012625428B2

(12) United States Patent
Endo et al.

(10) Patent No.: US 12,625,428 B2
(45) Date of Patent: May 12, 2026

(54) STEPPED SUBSTRATE COATING COMPOSITION INCLUDING COMPOUND HAVING PHOTOCROSSLINKING GROUP DUE TO UNSATURATED BOND BETWEEN CARBON ATOMS

(71) Applicant: NISSAN CHEMICAL CORPORATION, Tokyo (JP)

(72) Inventors: Takafumi Endo, Toyama (JP); Keisuke Hashimoto, Toyama (JP); Hirokazu Nishimaki, Toyama (JP); Mamoru Tamura, Toyama (JP); Rikimaru Sakamoto, Toyama (JP); Hikaru Tokunaga, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1263 days.

(21) Appl. No.: 16/083,869

(22) PCT Filed: Mar. 7, 2017

(86) PCT No.: PCT/JP2017/009054

§ 371 (c)(1),
(2) Date: Sep. 10, 2018

(87) PCT Pub. No.: WO2017/154921

PCT Pub. Date: Sep. 14, 2017

(65) Prior Publication Data

US 2019/0079397 A1 Mar. 14, 2019

(30) Foreign Application Priority Data

Mar. 10, 2016 (JP) ................................ 2016-047065
Jan. 16, 2017 (JP) ................................ 2017-005150

(51) Int. Cl.

| | |
|---|---|
| ***G03F 7/11*** | (2006.01) |
| ***G03F 7/00*** | (2006.01) |
| ***G03F 7/023*** | (2006.01) |
| ***G03F 7/025*** | (2006.01) |
| ***G03F 7/027*** | (2006.01) |
| ***G03F 7/038*** | (2006.01) |
| ***G03F 7/09*** | (2006.01) |
| ***G03F 7/20*** | (2006.01) |
| ***G03F 7/38*** | (2006.01) |
| ***H01L 21/027*** | (2006.01) |

(52) U.S. Cl.

CPC .......... *G03F 7/0236* (2013.01); *G03F 7/0035* (2013.01); *G03F 7/025* (2013.01); *G03F 7/027* (2013.01); *G03F 7/0275* (2013.01); *G03F 7/038* (2013.01); *G03F 7/0388* (2013.01); *G03F 7/094* (2013.01); *G03F 7/11* (2013.01); *G03F 7/2004* (2013.01); *G03F 7/38* (2013.01); *H01L 21/0271* (2013.01)

(58) Field of Classification Search

CPC ...... G03F 7/0236; G03F 7/0035; G03F 7/025; G03F 7/027; G03F 7/0275; G03F 7/038; G03F 7/0388; G03F 7/094; G03F 7/11; G03F 7/2004; G03F 7/38; G03F 7/0007; G03F 7/0755; G03F 7/0757; G03F 7/325; G03F 7/0397; G03F 7/20; G03F 7/40; H01L 21/0271; C08G 63/52; C08G 63/695; G02B 1/04; G02B 5/23; G02B 5/223; Y10T 428/24802

See application file for complete search history.

(56) References Cited

U.S. PATENT DOCUMENTS

| | | | | |
|---|---|---|---|---|
| 2011/0269866 A1* | 11/2011 | Jeong | G03F 7/038 | 522/39 |
| 2013/0266777 A1* | 10/2013 | Kato | G03F 7/20 | 428/195.1 |
| 2015/0060746 A1* | 3/2015 | Hsieh | C08G 63/695 | 252/586 |
| 2016/0139509 A1 | 5/2016 | Hashimoto et al. | | |
| 2016/0222248 A1 | 8/2016 | Endo et al. | | |
| 2017/0199454 A1* | 7/2017 | Lee | G03F 7/033 | |

FOREIGN PATENT DOCUMENTS

| | | |
|---|---|---|
| CN | 105324720 A | 2/2016 |
| JP | S63-271334 A | 11/1988 |

(Continued)

OTHER PUBLICATIONS

English translation of JP 2010-160300 A; Araki Hitoshi; Published: Jul. 22, 2010 (Year: 2010).*

(Continued)

*Primary Examiner* — Mark F. Huff
*Assistant Examiner* — Richard David Champion
(74) *Attorney, Agent, or Firm* — Oliff PLC

(57) ABSTRACT

A stepped substrate coating composition includes: a compound (E) containing partial structures (I) and (II) and a solvent (F). The partial structure (II) contains a hydroxy group generated by an epoxy group and a proton-generating compound reaction; the partial structure (I) is at least one partial structure selected from partial structures of Formula (1-1) to Formula (1-5) or a partial structure combining a partial structure of Formula (1-6) and Formula (1-7) or Formula (1-8); and the partial structure (II) is a partial structure of Formula (2-1) or Formula (2-2). The photocurable stepped substrate coating composition wherein in the compound (E), the epoxy group and the hydroxy group are contained in a molar ratio of $0 \leq$(Epoxy group)/(Hydroxy group)$\leq 0.5$ and the partial structure (II) is contained in a molar ratio of $0.01 \leq$(Partial structure (II))/(Partial structure (I)+Partial structure (II))$\leq 0.8$.

21 Claims, No Drawings

(56) References Cited

FOREIGN PATENT DOCUMENTS

| | | | | |
|---|---|---|---|---|
| JP | 2004-533637 | A | | 11/2004 |
| JP | 2005-508089 | A | | 3/2005 |
| JP | 2010160300 | A | * | 7/2010 |
| JP | 2013-186225 | A | | 9/2013 |
| TW | 201525050 | A | | 7/2015 |
| WO | 2006/115044 | A1 | | 11/2006 |
| WO | 2007/066597 | A1 | | 6/2007 |
| WO | 2008/047638 | A1 | | 4/2008 |
| WO | 2009/008446 | A1 | | 1/2009 |
| WO | 2010/126116 | A1 | | 11/2010 |
| WO | 2012/137807 | A1 | | 10/2012 |
| WO | 2013/077358 | A1 | | 5/2013 |

OTHER PUBLICATIONS

Jun. 6, 2017 International Search Report issued in International Patent Application No. PCT/JP2017/009054.

Jun. 6, 2017 Written Opinion of the International Searching Authority issued in International Patent Application No. PCT/JP2017/009054.

* cited by examiner

STEPPED SUBSTRATE COATING COMPOSITION INCLUDING COMPOUND HAVING PHOTOCROSSLINKING GROUP DUE TO UNSATURATED BOND BETWEEN CARBON ATOMS

TECHNICAL FIELD

The present invention relates to a stepped substrate coating composition for forming a planarization film on a substrate having a step by photocrosslinking and a method for producing a planarized layered substrate using the stepped substrate coating composition.

BACKGROUND ART

In recent years, semiconductor integrated circuit devices have been processed in accordance with fine design rules. In order to form a finer resist pattern by a photolithography technique, the exposure wavelength is required to be shortened.

The depth of focus, however, decreases with the shortening of the exposure wavelength. Therefore, the planarization property of the coated film formed on the substrate is required to be improved. In other words, in order to produce a semiconductor device having a fine design rule, a planarization technique on a substrate has become important.

Heretofore, as methods for forming a planarization film, for example, a method for forming a resist underlayer film formed under a resist film by photocuring has been described.

A resist underlayer film-forming composition including a polymer having epoxy groups or oxetane groups in side chains and a photo cationic polymerization initiator or a resist underlayer film-forming composition including a polymer having a radical polymerizable ethylenic unsaturated bond and a photoradical polymerization initiator has been described (refer to Patent Document 1).

A resist underlayer film-forming composition including a silicon compound having a cationically polymerizable reactive group such as an epoxy group and a vinyl group, a photo cationic polymerization initiator, and a photoradical polymerization initiator has been described (refer to Patent Document 2).

A method for producing a semiconductor device using a resist underlayer film including a polymer having crosslinkable functional groups (for example, hydroxy groups) in side chains, a crosslinking agent, and a photoacid generator has been described (refer to Patent Document 3).

A resist underlayer film that is not a photocrosslinking-based resist underlayer film but has an unsaturated bond in its main chain or side chain has been described (refer to Patent Documents 4 and 5).

PRIOR ART DOCUMENTS

Patent Documents

Patent Document 1: WO 2006/115044 Pamphlet
Patent Document 2: WO 2007/066597 Pamphlet
Patent Document 3: WO 2008/047638 Pamphlet
Patent Document 4: WO 2009/008446 Pamphlet
Patent Document 5: Japanese Translation of PCT Application No. 2004-533637

SUMMARY OF THE INVENTION

Problem to be Solved by the Invention

In a conventional resist underlayer film-forming composition including a polymer having a thermally crosslinkable functional group such as a hydroxy group, a crosslinking agent, and an acid catalyst (acid generator), in the case of a conventional photocrosslinking material, a viscosity increases as crosslinking reaction proceeds at the time of heating the composition so that the composition is filled into the pattern formed on the substrate (for example, a hole or a trench structure), resulting in causing a problem of poor filling into the pattern. In addition, heat shrinkage due to degasification occurs and thus a problem of impairing flatness arises.

In the case of the resist underlayer film-forming composition including a polymer having a cationically polymerizable reactive group such as an epoxy group and a vinyl group and an acid generator, light irradiation and heating are carried out. At this time, heat shrinkage due to the degasification also occurs and thus a problem of flatness arises.

Therefore, an object of the present invention is to provide a stepped substrate coating composition that has a high filling property into a pattern and is for forming a coated film being capable of forming a coating film that does not cause degasification or heat shrinkage and having a planarization property.

Means for Solving the Problem

The present invention includes, as a first aspect, a photocurable stepped substrate coating composition comprising: a compound (E) containing a partial structure (I) and a partial structure (II) and a solvent (F), in which the partial structure (II) contains a hydroxy group generated by a reaction of an epoxy group and a proton-generating compound; the partial structure (I) is at least one partial structure selected from the group consisting of partial structures of Formula (1-1) to Formula (1-5) or a partial structure combining a partial structure of Formula (1-6) and a partial structure of Formula (1-7) or Formula (1-8); and the partial structure (II) is a partial structure of Formula (2-1) or Formula (2-2), Formula (1-1)

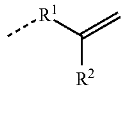

Formula (1-2)

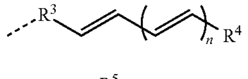

Formula (1-3)

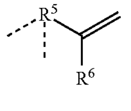

Formula (1-4)

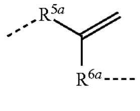

-continued

Formula (1-5)

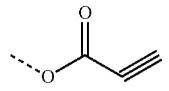

Formula (1-6)

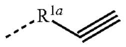

Formula (1-7)

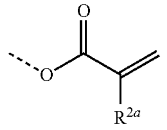

Formula (1-8)

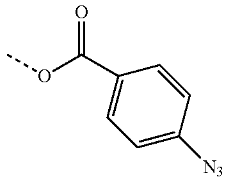

Formula (2-1)

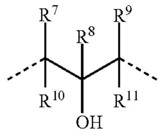

Formula (2-2)

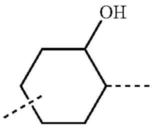

(wherein $R^1$, $R^{1a}$, $R^3$, $R^5$, $R^{5a}$, and $R^{6a}$ each are a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a combination thereof; $R^2$, $R^{2a}$, $R^4$, and $R^6$ each are a hydrogen atom, a $C_{1-10}$ saturated hydrocarbon group, a $C_{2-10}$ unsaturated hydrocarbon group, an oxygen atom, a carbonyl group, an amide group, an amino group, or a combination thereof; $R^2$, $R^{2a}$, $R^4$, and $R^6$ each are a monovalent group, $R^1$, $R^{1a}$, $R^3$, $R^{5a}$, and $R^{6a}$ each are a divalent group, and $R^5$ is a trivalent group; $R^7$, $R^8$, $R^9$, $R^{10}$, and $R^{11}$ each are a hydrogen atom or a $C_{1-10}$ saturated hydrocarbon group; n is the number of repeating units of 1 to 10; and a dotted line indicates a chemical bond with an adjacent atom), as a second aspect, the photocurable stepped substrate coating composition according to the first aspect, in which in the compound (E), the epoxy group and the hydroxy group are contained in a molar ratio of 0≤(Epoxy group)/(Hydroxy group)≤0.5 and the partial structure (II) is contained in a molar ratio of 0.01≤(Partial structure (II))/(Partial structure (I)+Partial structure (II))≤0.8, as a third aspect, the photocurable stepped substrate coating composition according to the first aspect or the second aspect, in which the compound (E) is a compound containing at least one partial structure (I) and at least one partial structure (II), as a fourth aspect, the photocurable stepped substrate coating composition according to any one of the first aspect to the third aspect, in which $R^{5a}$ and $R^{6a}$ each are a divalent group including a $C_{1-10}$ alkylene group, a $C_{6-40}$ arylene group, an oxygen atom, a carbonyl group, a sulfur atom, or a combination thereof, as a fifth aspect, the photocurable stepped substrate coating composition according to any one of the first aspect to the fourth aspect, in which the compound (E) is a compound (1) obtained by a reaction of a proton-generating compound (A) containing an unsaturated bond between carbon atoms and an epoxy compound (B), a compound (2) obtained by a reaction of an epoxy compound (C) containing an unsaturated bond between carbon atoms and a proton-generating compound (D), a compound (3) obtained by a reaction of the proton-generating compound (A) containing an unsaturated bond between carbon atoms, a proton-generating compound (A') containing a photodegradable group, and the epoxy compound (B), or a compound (4) obtained by a reaction of a hydroxy group generated by a reaction of the epoxy compound (B) or epoxy compound (C) containing an unsaturated bond between carbon atoms and the proton-generating compound (A) containing an unsaturated bond between carbon atoms, the proton-generating compound (A) containing an unsaturated bond between carbon atoms and the proton-generating compound (A') containing a photodegradable group, or a proton-generating compound (D) and a compound (G) containing an unsaturated bond capable of reacting with the hydroxy group, as a sixth aspect, the photocurable stepped substrate coating composition according to the fifth aspect, in which when the compound (E) is the compound (1), the compound (3), or the compound (4), the compound (E) is obtained by a reaction in which the proportion of the protons generated from the proton-generating compound (A) containing an unsaturated bond between carbon atoms or the proton-generating compound (A) containing an unsaturated bond between carbon atoms and the proton-generating compound (A) containing a photodegradable group and the epoxy groups of the epoxy compound (B) is 1:1 to 1:1.5 in a molar ratio, as a seventh aspect, the photocurable stepped substrate coating composition according to the fifth aspect, in which when the compound (E) is the compound (2) or the compound (4), the compound (E) is obtained by a reaction in which the proportion of the epoxy groups of the epoxy compound (C) containing an unsaturated bond between carbon atoms and the protons generated from the proton-generating compound (D) is 1:1 to 1.5:1 in a molar ratio, as an eighth aspect, the photocurable stepped substrate coating composition according to the fifth aspect or the sixth aspect, in which the proton-generating compound (A) containing an unsaturated bond between carbon atoms is a carboxylic acid compound containing an unsaturated bond between carbon atoms, an acid anhydride containing an unsaturated bond between carbon atoms, an amine compound containing an unsaturated bond between carbon atoms, an amide compound containing an unsaturated bond between carbon atoms, an isocyanurate compound containing an unsaturated bond between carbon atoms, a phenol compound containing an unsaturated bond between carbon atoms, or a thiol compound containing an unsaturated bond between carbon atoms, as a ninth aspect, the photocurable stepped substrate coating composition according to the fifth aspect or the sixth aspect, in which the epoxy compound (B) is a glycidyl group-containing ether compound, a reaction product of a phenolic hydroxy group-containing compound and epichlorohydrin, a reaction product of a phenolic hydroxy group-containing resin and epichlorohydrin, a glycidyl group-containing isocyanurate compound, an epoxycyclohexyl group-containing compound, an epoxy group-substituted cyclohexyl compound, or a glycidyl ester compound, as a tenth aspect, the photocurable stepped substrate coating composition according to the fifth aspect or the sixth aspect, in which the proton-generating compound (A') containing a photodegradable group is an azide group-containing compound, as an eleventh aspect, the photocurable stepped substrate coating composition according to the fifth aspect or the seventh aspect, in which the epoxy compound (C) containing an unsaturated bond between carbon atoms is a glycidyl ester compound containing an unsaturated bond between carbon atoms, a reaction product of a phenolic hydroxy group-containing compound containing an unsaturated bond between carbon atoms and epichlorohydrin, or a reaction product of a phenolic hydroxy group-containing resin containing an unsaturated bond between carbon atoms and epichlorohydrin, as a twelfth aspect, the photocurable stepped substrate coating composition according to the fifth aspect or the seventh aspect, in which the proton-generating compound (D) is a phenolic hydroxy group-containing compound, a carboxylic acid-containing compound, an amine-containing compound, a thiol-containing compound, or an imide-containing compound, as a thirteenth aspect, the photocurable stepped substrate coating composition according to the fifth aspect or the seventh aspect, in which the compound (G) is an acid halide compound, an acid anhydride, an isocyanate compound, or an alkyl halide compound containing an unsaturated bond between carbon and carbon or the proton-generating compound (A) containing an unsaturated bond between carbon atoms, as a fourteenth aspect, the photocurable stepped substrate coating composition according to any one of the first aspect to the thirteenth aspect, in which the compound (E) comprises each of the partial structure (I) and the partial structure (II) in a proportion of 1 structure to 1000 structures, as a fifteenth aspect, the photocurable stepped substrate coating composition according to any one of the first aspect to the fourteenth aspect, in which the stepped substrate coating composition is a resist underlayer film-forming composition used in a lithography process for producing a semiconductor device, as a sixteenth aspect, a method for producing a coated substrate comprising: (i) applying the photocurable stepped substrate coating composition according to any one of the first aspect to the fifteenth aspect to a substrate having a step, and (ii) performing exposure of the applied composition to light, as a seventeenth aspect, the method for producing a coated substrate according to the sixteenth aspect, further comprising (ia) heating the applied composition at 70° C. to 400° C. for 10 seconds to 5 minutes after the step (i) of applying the photocurable stepped substrate coating composition, as an eighteenth aspect, the method for producing a coated substrate according to the sixteenth aspect or seventeenth aspect, in which the exposure wavelength in the step (ii) is 150 nm to 248 nm, as a nineteenth aspect, the method for producing a coated substrate according to any one of the sixteenth aspect to the eighteenth aspect, in which the exposure amount in the step (ii) is 10 $mJ/cm^2$ to 3,000 $mJ/cm^2$, as a twentieth aspect, the method for producing a coated substrate according to any one of the sixteenth aspect to the nineteenth aspect, in which the substrate has an open area (non-pattern area) and pattern areas of DENCE (dense) and ISO (coarse) and an aspect ratio of the pattern is 0.1 to 10, as a twenty-first aspect, the method for producing a coated substrate according to any one of the sixteenth aspect to the twentieth aspect, in which Bias (coating step) between the open area and the pattern areas is 1 nm to 50 nm, as a twenty-second aspect, a method for producing a semiconductor device comprising: forming an underlayer film using the stepped substrate coating composition according to any one of the first aspect to the fifteenth aspect on a substrate having a step; forming a resist film thereon; forming a resist pattern by irradiation with light or electron beams and development; etching the underlayer film using the formed resist pattern; and processing the semiconductor substrate using the patterned underlayer film, as a twenty-third aspect, the method for producing a semiconductor device according to the twenty-second aspect, in which the substrate having a step is a substrate having an open area (non-pattern area) and pattern areas of DENCE (dense) and ISO (coarse) and having an aspect ratio of the pattern of 0.1 to 10, as a twenty-fourth aspect, the method for producing a semiconductor device according to the twenty-second aspect, in which the step of forming an underlayer film using the stepped substrate coating composition comprises (i) applying the photocurable stepped substrate coating composition according to any one of the first aspect to the fifteenth aspect to a substrate having a step, and (ii) performing exposure of the applied composition to light, as a twenty-fifth aspect, the method for producing a semiconductor device according to the twenty-fourth aspect, further comprising (ia) heating the applied composition at 70° C. to 400° C. for 10 seconds to 5 minutes after the step (i) of applying the photocurable stepped substrate coating composition, as a twenty-sixth aspect, the method for producing a semiconductor device according to the twenty-fourth aspect or the twenty-fifth aspect, in which the exposure wavelength in the step (ii) is 150 nm to 248 nm, as a twenty-seventh aspect, the method for producing a semiconductor device according to any one of the twenty-fourth aspect to the twenty-sixth aspect, in which the exposure amount in the step (ii) is 10 $mJ/cm^2$ to 3,000 $mJ/cm^2$, as a twenty-eighth aspect, the method for producing a semiconductor device according to the twenty-second aspect, in which the underlayer film obtained from the stepped substrate coating composition has a coating step of 1 nm to 50 nm, as a twenty-ninth aspect, a method for producing a semiconductor device comprising: forming an underlayer film using the photocurable stepped substrate coating composition according to any one of the first aspect to the fifteenth aspect on a substrate having a step; forming a hard mask thereon; further forming a resist film thereon;

forming a resist pattern by irradiation of light or electron beams and development; etching the hard mask using the formed resist pattern; etching the underlayer film using the patterned hard mask; and processing a semiconductor substrate using the patterned underlayer film, as a thirtieth aspect, the method for producing a semiconductor device according to the twenty-ninth aspect, in which the substrate having a step is a substrate having an open area (non-pattern area) and pattern areas of DENCE (dense) and ISO (coarse) and having an aspect ratio of the pattern of 0.1 to 10, as a thirty-first aspect, the method for producing a semiconductor device according to the twenty-ninth aspect, in which the step of forming an underlayer film using the stepped substrate coating composition comprises (i) applying the photocurable stepped substrate coating composition according to any one of the first aspect to the fifteenth aspect to a substrate having a step, and (ii) performing exposure of the applied composition to light, as a thirty-second aspect, the method for producing a semiconductor device according to the thirty-first aspect, further comprising (ia) heating the applied composition at 70° C. to 400° C. for 10 seconds to 5 minutes after the step (i) of applying the photocurable stepped substrate coating composition, as a thirty-third aspect, the method for producing a semiconductor device according to the thirty-first aspect or the thirty-second aspect, in which the exposure wavelength in the step (ii) is 150 nm to 248 nm, as a thirty-fourth aspect, the method for producing a semiconductor device according to any one of the thirty-first aspect to the thirty-third aspect, in which the exposure amount in the step (ii) is 10 $mJ/cm^2$ to 3,000 $mJ/cm^2$, and as a thirty-fifth aspect, the method for producing a semiconductor device according to the twenty-ninth aspect, in which the underlayer film obtained from the stepped substrate coating composition has a coating step of 1 nm to 50 nm.

Effects of the Invention

The stepped substrate coating composition is applied onto the stepped substrate and, in some cases, further filled into a pattern due to reflow by heating. The stepped substrate coating composition of the present invention does not have a thermal crosslinking site or an acid catalyst and thus viscosity is not increased at the time of use. Consequently, the stepped substrate coating composition of the present invention can form a flat film irrespective of the open area (non-pattern area) and the pattern areas of DENCE (dense) and ISO (coarse) on the stepped substrate. In the stepped substrate coating composition of the present invention, the compound included in the stepped substrate coating composition has an unsaturated bond between carbon and carbon and thus a crosslinked structure between the unsaturated bonds is formed with each other due to radical species by light irradiation. In other words, although the stepped substrate coating composition of the present invention does not include a crosslinking agent or an acid catalyst, the stepped substrate coated film (planarization film) formed by applying the stepped substrate coating composition can be crosslinked by a reaction between double bonds or triple bonds originated from unsaturated bonds between carbon and carbon.

Therefore, the stepped substrate coated film (planarization film) formed from the stepped substrate coating composition of the present invention does not cause a crosslinking reaction with the crosslinking agent and the acid catalyst at the time of thermal reflowing. Because the subsequent photocrosslinking is a photoreaction without degasification, heat shrinkage does not occur. Consequently, the stepped substrate coating composition of the present invention can provide an excellent planarization film that simultaneously satisfies an excellent filling property to the pattern and flatness after the filling.

MODES FOR CARRYING OUT THE INVENTION

The present invention includes a photocurable stepped substrate coating composition comprising: a compound (E) comprising a partial structure (I) and a partial structure (II) and a solvent (F), in which the partial structure (II) comprises a hydroxy group generated by a reaction of an epoxy group and a proton-generating compound, the partial structure (I) is at least one partial structure selected from the group consisting of partial structures of Formula (1-1) to Formula (1-5) or a partial structure combining a partial structures of Formula (1-6) and Formula (1-7) or Formula (1-8), and the partial structure (II) is a partial structure of Formula (2-1) or Formula (2-2).

The present invention also includes the photocurable stepped substrate coating composition including a compound (E) comprising a partial structure (I) and a partial structure (II) and a solvent (F), in which the partial structure (II) comprises a hydroxy group generated by a reaction of an epoxy group and a proton-generating compound; in the compound (E), the epoxy group and the hydroxy group are contained in a molar ratio of 0 (Epoxy group)/(Hydroxy group)≤0.5 and the partial structure (II) is contained in a molar ratio of 0.01≤(Partial structure (II))/(Partial structure (I)+Partial structure (II))≤0.8; the partial structure (I) is at least one partial structure selected from the group consisting of partial structures of Formula (1-1) to Formula (1-5) or a partial structure combining partial structures of Formula (1-6) and Formula (1-7) or Formula (1-8); and the partial structure (II) is a partial structure of Formula (2-1) or Formula (2-2).

Examples of the partial structure (I) include a combination of the partial structure of Formula (1-1), the partial structure of Formula (1-2), the partial structure of Formula (1-3), the partial structure of Formula (1-4), the partial structure of Formula (1-5), and the partial structure of Formula (1-6) with the partial structure of Formula (1-7), or a combination of the partial structure of Formula (1-6) with the partial structure of Formula (1-8). Examples of the partial structure (I) also include a combination of the partial structure of Formula (1-1) with the partial structure of Formula (1-3) or a combination of the partial structure of Formula (1-1) with the partial structure of Formula (1-4).

In Formula (1-1) to Formula (1-4), Formula (1-6), Formula (1-7), and Formula (2-1), $R^1$, $R^{1a}$, $R^3$, $R^5$, $R^{5a}$, and $R^{6a}$ each are a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a combination thereof; $R^2$, $R^{2a}$, $R^4$, and $R^6$ each are a hydrogen atom, a $C_{1-10}$ saturated hydrocarbon group, a $C_{2-10}$ unsaturated hydrocarbon group, an oxygen atom, a carbonyl group, an amide group, an amino group, or a combination thereof; $R^2$, $R^{2a}$, $R^4$, and $R^6$ each are a monovalent group, $R^1$, $R^{1a}$, $R^3$, $R^{5a}$, and $R^{6a}$ each are a divalent group, and $R^5$ is a trivalent group; $R^7$, $R^8$, $R^9$, $R^{10}$, and $R^{11}$ each are a hydrogen atom or a $C_{1-10}$ saturated hydrocarbon group; n is the number of repeating units of 1 to 10; and a dotted line indicates a chemical bond with an adjacent atom.

In Formula (1-4), $R^{5a}$ and $R^{6a}$ each are a divalent group including a $C_{1-10}$ alkylene group, a $C_{6-40}$ arylene group, an oxygen atom, a carbonyl group, a sulfur atom, or a combination thereof.

The chemical bonds of both partial structures are formed by bonding the dotted line part of $R^1$ of Formula (1-1), the dotted line part of $R^3$ of Formula (1-2), the dotted line parts of $R^5$ of Formula (1-3), the dotted line parts of $R^{5a}$ and $R^{6a}$ of Formula (1-4), the dotted line part of the oxygen atom of the ester group of Formula (1-5), the dotted line part of $R^{1a}$ of Formula (1-6), the dotted line part of the oxygen atom of the ester group of Formula (1-7), and the dotted line part of the oxygen atom of the ester group of Formula (1-8) to the individual dotted line parts of Formula (2-1) and dotted line parts of Formula (2-2).

The stepped substrate coating composition may include additives such as a surfactant, if necessary.

The solid content of the stepped substrate coating composition is 0.1% by mass to 70% by mass, 0.1% by mass to 60% by mass, 0.2% by mass to 30% by mass, or 0.3% by mass to 15% by mass. The solid content is a content ratio of the whole components of the stepped substrate coating composition from which the solvent is removed. In the stepped substrate coating composition, the compound (E) can be included in a proportion of the solid content of 1% by mass to 100% by mass, 1% by mass to 99.9% by mass, 50% by mass to 99.9% by mass, 50% by mass to 95% by mass, or 50% by mass to 90% by mass.

The compound (E) used in the present invention has an average molecular weight of 600 to 1,000,000, 600 to 200,000, or 1,500 to 15,000.

The compound (E) can form a crosslinked structure by photoreaction of the unsaturated bonds between carbon and carbon between molecules or in a molecule. At least one unsaturated bond between the carbon atoms, that is, an unsaturated double bond between carbon atoms may be contained in a molecule or a plurality of the unsaturated bond (for example, one unsaturated bond to 1,000 unsaturated bonds) may be contained in a molecule.

In the compound (E), the partial structure (I) and the partial structure (II) can be modified in the range of a molar ratio of $0.01 \leq$(Partial structure (II))/(Partial structure (I)+Partial structure (II))$\leq 0.8$. The compound (E) can be a compound containing at least one partial structure (I) and at least one partial structure (II).

Here, when the value of (Partial structure (II))/(Partial structure (I)+Partial structure (II)) is higher than 0.8, the proportion of functional groups that can cause photoreaction is decreased, which is not preferable, whereas when the value of (Partial structure (II))/(Partial structure (I)+Partial structure (II)) is lower than 0.01, the stability as the photocurable stepped substrate coating composition deteriorates and thus adhesion and applicability to the substrate deteriorate, which is not preferable.

The $C_{1-10}$ saturated hydrocarbon group may be a $C_{1-10}$ alkyl group and examples of the $C_{1-10}$ alkyl group may include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl-group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclopropyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

As the $C_{1-10}$ saturated hydrocarbon group, a divalent alkylene group derived from the alkyl group can be exemplified.

As the $C_{2-10}$ unsaturated hydrocarbon group, an alkenyl group or an alkynyl group corresponding to the alkyl group having two or more carbon atoms can be exemplified.

The $C_{6-40}$ aromatic hydrocarbon group may be a divalent $C_{6-40}$ arylene group and examples of the $C_{6-40}$ aromatic hydrocarbon group include phenylene group, biphenylene group, terphenylene group, fluorenylene group, naphthylene group, anthrylene group, pyrenylene group, and carbazolylene group.

In Formula (1-4) of the partial structure (I), $R^{5a}$ and $R^{6a}$ each may be divalent group including a $C_{1-10}$ alkylene group, a $C_{6-40}$ arylene group, an oxygen atom, a carbonyl group, a sulfur atom, or a combination thereof.

In the partial structure (I), Formula (1-4) bonds with the unit structure of Formula (II) to form a chain polymer. When $R^{5a}$ and $R^{6a}$ include these groups, the ability to form a crosslinked structure by photoreaction is enhanced, which is preferable.

The compound (E) may also be a compound (1) obtained by a reaction of a proton-generating compound (A) containing an unsaturated bond between carbon atoms and an epoxy compound (B),

- a compound (2) obtained by a reaction of an epoxy compound (C) containing an unsaturated bond between carbon atoms and a proton-generating compound (D),
- a compound (3) obtained by a reaction of the proton-generating compound (A)containing an unsaturated bond between carbon atoms, a proton-generating compound (A') containing a photodegradable group, and the epoxy compound (B), or
- a compound (4) obtained by a reaction of a hydroxy group generated by a reaction of the epoxy compound (B) or epoxy compound (C) containing an unsaturated bond between carbon atoms and the proton-generating compound (A) containing an unsaturated bond between carbon atoms, the proton-generating compound (A') containing the proton-generating compound (A) containing an unsaturated bond between carbon atoms and a photodegradable group, or a proton-generating compound (D) and a compound (G) containing an unsaturated bond capable of reacting with the hydroxy group.

The partial structure (II) contains a hydroxy group generated by the reaction of the epoxy group and the proton-generating compound. In the compound (E), the epoxy group and the hydroxy group may be contained in a molar ratio of 0≤(Epoxy group)/(Hydroxy group)≤0.5. The epoxy compound (B) or (C) is reacted with the proton-generating compound (A) or (D) to cause an addition reaction to the epoxy group and to generate a hydroxy group. The proportion of the addition reaction is a molar ratio of 0≤(Epoxy group)/(Hydroxy group)≤0.5. The amount of residual epoxy groups is preferably small and the epoxy groups in the compound (E) desirably zero or a value close to zero from the viewpoint of photoreactivity.

The compound (E) may be a compound obtained by a reaction in which the proportion of the protons generated from the proton-generating compound (A) containing an unsaturated bond between carbon atoms or the proton-generating compound (A') containing the proton-generating compound (A) containing an unsaturated bond between carbon atoms and a photodegradable group and epoxy groups of the epoxy compound (B) is 1:1 to 1:1.5 in a molar ratio.

The compound (E) may also be a compound obtained by a reaction in which the proportion of the epoxy groups of the epoxy compound (C) containing an unsaturated bond between carbon atoms and the protons generated from the proton-generating compound (D) is 1:1 to 1.5:1 in a molar ratio.

The proton-generating compound (A) containing an unsaturated bond between carbon atoms reacts with the epoxy group of the epoxy compound (B) to form the partial structure (I) and the partial structure (II). $R^1$, $R^3$, $R^5$, $R^{5a}$, $R^{6a}$, $R^{1a}$, and the oxygen atom of the ester group in the partial structure (I) form bonds to the carbon atom between $R^7$ and $R^{10}$, the carbon atom between $R^9$ and $R^{11}$, or the hydroxycyclohexyl ring in the partial structure (II).

Examples of the proton-generating compound (A) containing an unsaturated bond between carbon atoms may include a carboxylic acid compound containing an unsaturated bond between carbon atoms, an acid anhydride containing an unsaturated bond between carbon atoms, an amine compound containing an unsaturated bond between carbon atoms, an amide compound containing an unsaturated bond between carbon atoms, an isocyanurate compound containing an unsaturated bond between carbon atoms, a phenol compound containing an unsaturated bond between carbon atoms, or a thiol compound containing an unsaturated bond between carbon atoms.

Examples of the epoxy compound (B) may include a glycidyl group-containing ether compound, a reaction product of a phenolic hydroxy group-containing compound and epichlorohydrin, a reaction product of a phenolic hydroxy group-containing resin and epichlorohydrin, a glycidyl group-containing isocyanurate compound, an epoxycyclohexyl group-containing compound, an epoxy group-substituted cyclohexyl compound, or a glycidyl ester compound.

The epoxy group of the epoxy compound (C) containing an unsaturated bond between carbon atoms reacts with the proton-generating group of the proton-generating compound (D) to form the partial structure (I) and the partial structure (II). $R^1$, $R^3$, $R^5$, $R^{5a}$, $R^{6a}$, $R^{1a}$, and the oxygen atom of the ester group in the partial structure (I) form bonds to the carbon atom between $R^7$ and $R^{10}$, the carbon atom between $R^9$ and $R^{11}$, or the hydroxycyclohexyl ring in the partial structure (II).

Examples of the epoxy compound (C) containing an unsaturated bond between carbon atoms may include a glycidyl ester compound containing an unsaturated bond between carbon atoms, a reaction product of a phenolic hydroxy group-containing compound containing an unsaturated bond between carbon atoms and epichlorohydrin, or a reaction product of a phenolic hydroxy group-containing resin containing an unsaturated bond between carbon atoms and epichlorohydrin.

Examples of the proton-generating compound (D) may include a phenolic hydroxy group-containing compound, a carboxylic acid-containing compound, an amine-containing compound, a thiol-containing compound, or an imide-containing compound.

The proportion of the unsaturated bonding group based on the partial structure (I) and the hydroxy group based on the partial structure (II) can be determined to be 0.01≤(Partial structure (II))/(Partial structure (I)+Partial structure (II))≤0.8 in a molar ratio. In the reaction between the compound (A) and the compound (B) or between the compound (C) and the compound (D), if the reaction of the proton-generating group and the epoxy group contained in these compounds occurs at a molar ratio of 1:1, the proportion of the unsaturated bond group between the carbon atoms based on the partial structure (I) and the hydroxy group based on the partial structure (II) is generated in the proportion at a molar ratio of 1:1. When an arbitrary compound having a proton-generating group having no unsaturated bond between carbon atoms is used, however, the proportion of the hydroxy group to be produced increases and, in the present invention, the molar ratio is in a proportion of up to 1:4.

The compound (E) contains each of the partial structure (I) and the partial structure (II) in a proportion of 1 structure to 1000 structures. This means that the compound (E) includes monomolecular compounds to polymers and each of the compounds (E) includes the structures in the proportion within the above range.

The proton-generating compound (A) containing an unsaturated bond between carbon atoms used in the present invention can be exemplified below.

Formula (A-1)

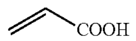

Formula (A-2)

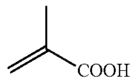

Formula (A-3)

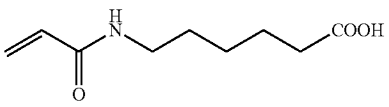

Formula (A-4)

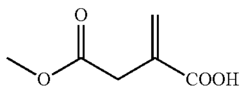

Formula (A-5)

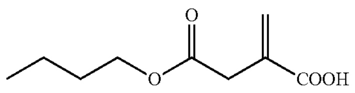

Formula (A-6)

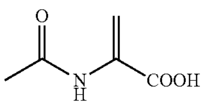

-continued

Formula (A-7)

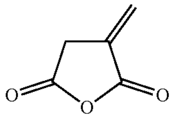

Formula (A-8)

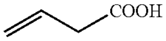

Formula (A-9)

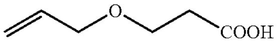

Formula (A-10)

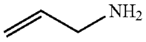

Formula (A-11)

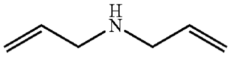

Formula (A-12)

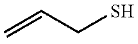

Formula (A-13)

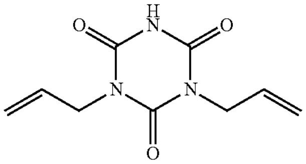

Formula (A-14)

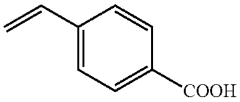

Formula (A-15)

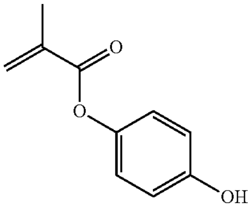

Formula (A-16)

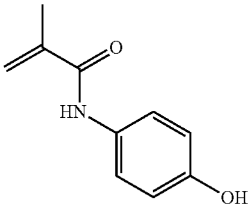

Formula (A-17)

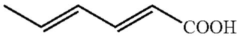

Formula (A-18)

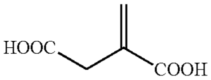

Formula (A-19)

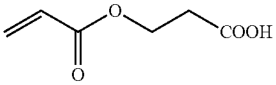

Formula (A-20)

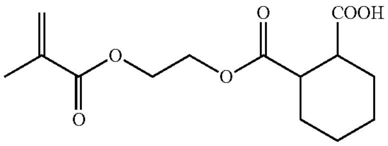

-continued

Formula (A-21)

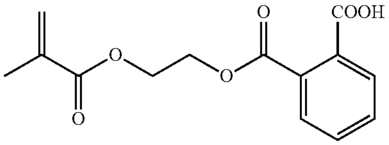

Formula (A-22)

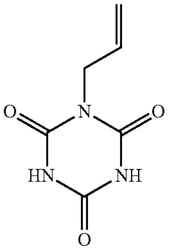

Formula (A-23)

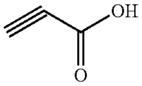

Formula (A-24)

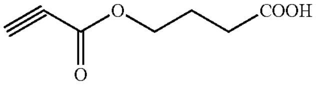

The above compounds can be obtained as reagents.

As the proton-generating compound containing a photodegradable group (A') used in the present invention, an azide group-containing compound can be exemplified.

Examples of the photodegradable group include a nitrogen-containing photodegradable group. The nitrogen-containing photodegradable group generates a chemical group containing a reactive nitrogen moiety (a nitrene group) or a reactive carbon moiety (a carbene group) due to generation of nitrogen gas by light irradiation. The reactive nitrogen moiety is also referred to as the nitrene group and reacts with, for example, an alkene or a benzene ring to form an aziridine ring or the like and to promote crosslinking.

Formula (A'-1)

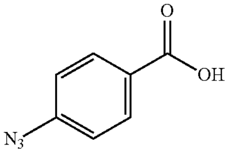

Formula (A'-2)

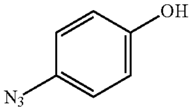

Formula (A'-3)

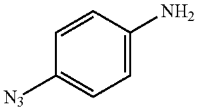

(Formula A'-4)

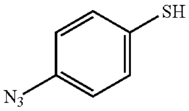

The epoxy compound (B) used in the present invention can be exemplified below.

Formula (B-1)
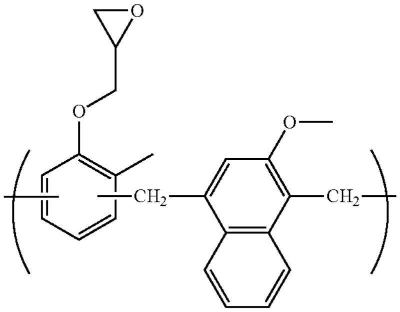
Formula (B-2)
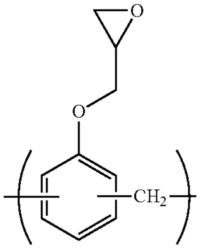
Formula (B-3)
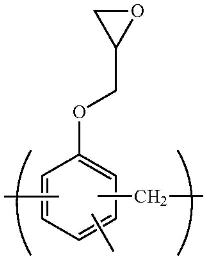
Formula (B-4)
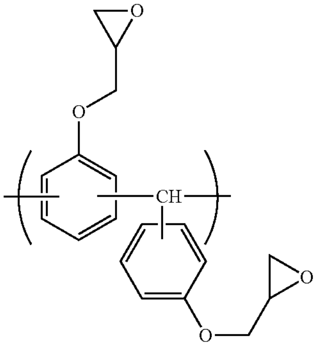
Formula (B-5)
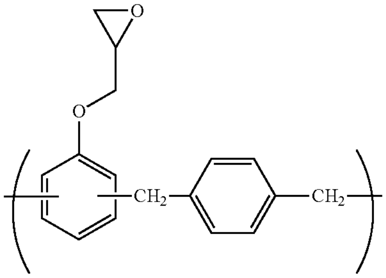
Formula (B-6)
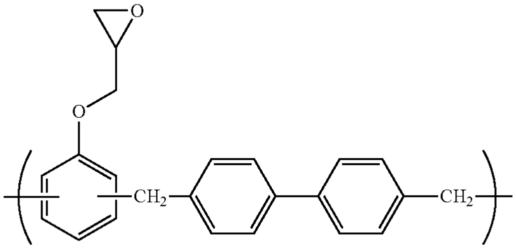
Formula (B-7)
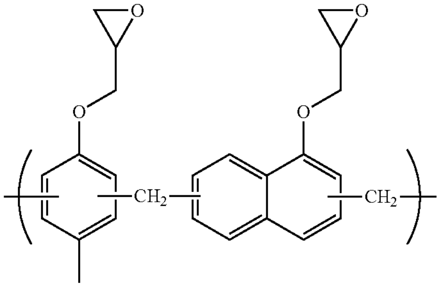
Formula (B-8)
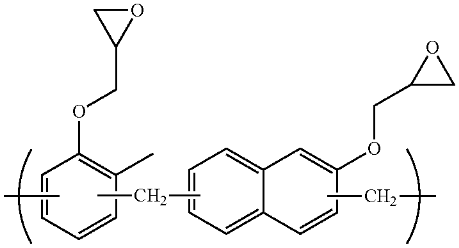
Formula (B-9)
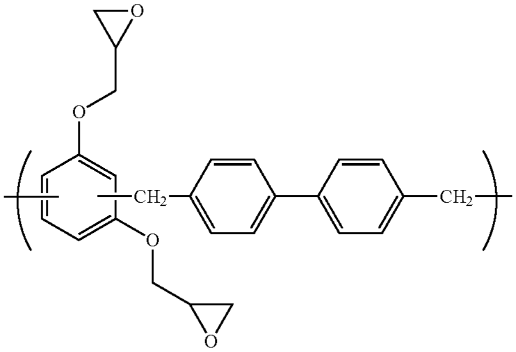
Formula (B-10)
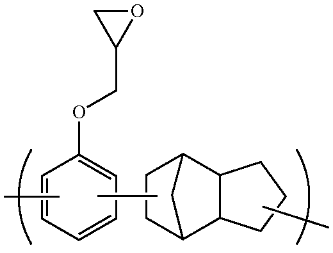

-continued
Formula (B-11)
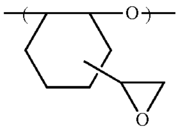
Formula (B-12)
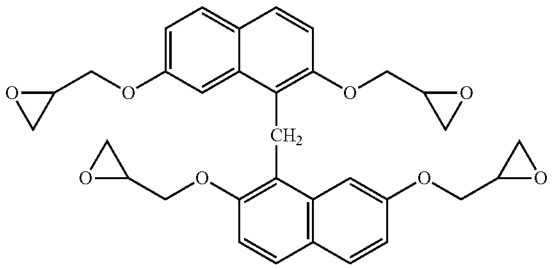
Formula (B-13)
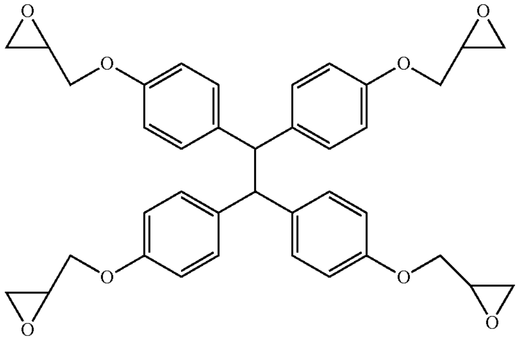
Formula (B-14)
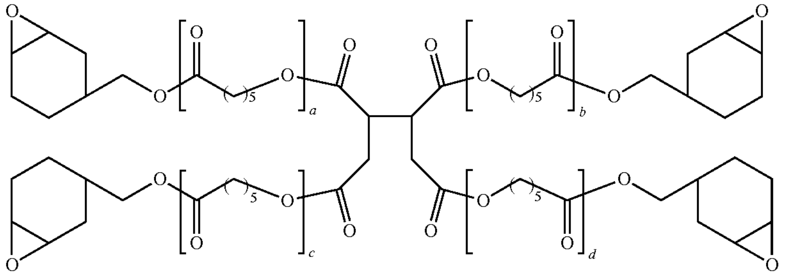
Formula (B-15)
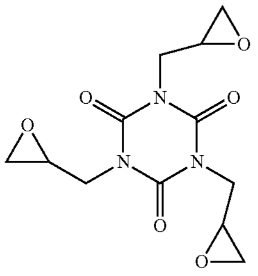
Formula (B-16)
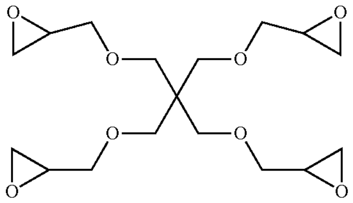
Formula (B-17)
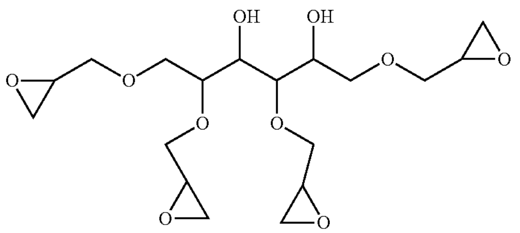
Formula (B-18)
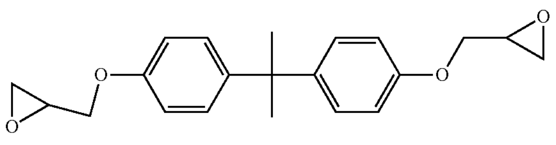

-continued

Formula (B-19)

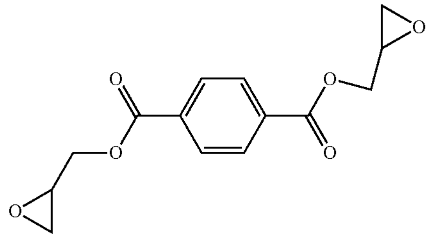

Formula (B-20)

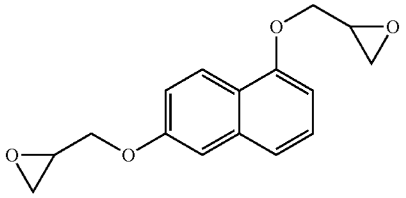

Formula (B-21)

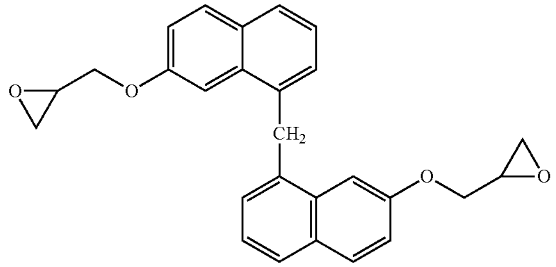

Formula (B-22)

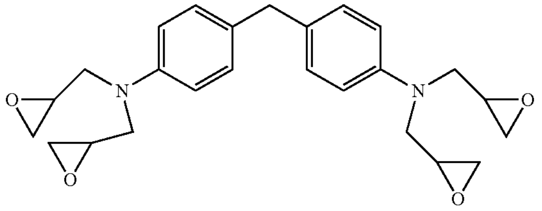

Formula (B-23)

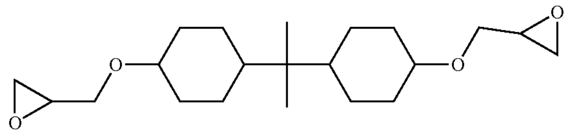

Formula (B-24)

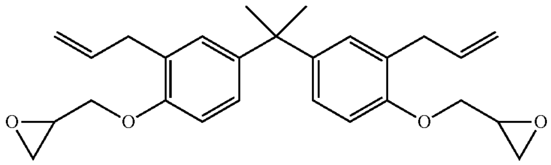

Formula (B-25)

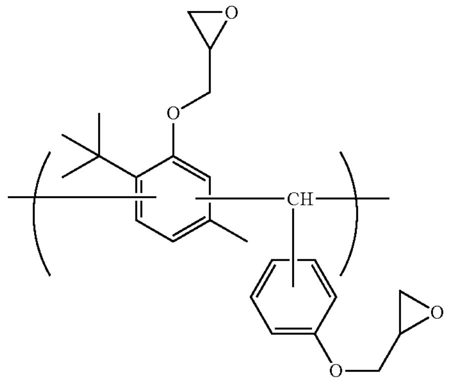

Formula (B-26)

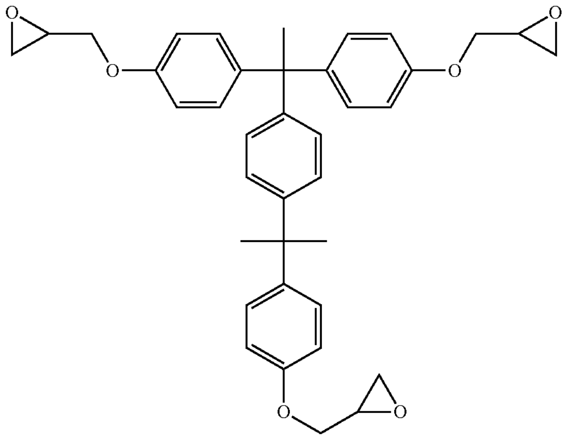

The compound of Formula (B-1) is available as EPICLON HP-5000 (trade name) manufactured by DIC Corporation.

The compound of Formula (B-2) is available as EPPN-501H (trade name) manufactured by Nippon Kayaku Co., Ltd.

The compound of Formula (B-3) is available as ECN-1229 (trade name) manufactured by Asahi Kasei Epoxy Co., Ltd.

The compound of Formula (B-4) is available as EPPN-501H (trade name) manufactured by Nippon Kayaku Co., Ltd.

The compound of Formula (B-5) is available as NC-2000L (trade name) manufactured by Nippon Kayaku Co., Ltd.

The compound of Formula (B-6) is available as NC-3000L (trade name) manufactured by Nippon Kayaku Co., Ltd.

The compound of Formula (B-7) is available as NC-7000L (trade name) manufactured by Nippon Kayaku Co., Ltd.

The compound of Formula (B-8) is available as NC-7300L (trade name) manufactured by Nippon Kayaku Co., Ltd.

The compound of Formula (B-9) is available as NC-3500 (trade name) manufactured by Nippon Kayaku Co., Ltd.

The compound of Formula (B-10) is available as HP-7200L (trade name) manufactured by DIC Corporation.

The compound of Formula (B-11) is available as EHPE-3150 (trade name) manufactured by Daicel Corporation.

The compound of Formula (B-12) is available as EPICLON HP-4700 (trade name) manufactured by DIC Corporation.

The compound of Formula (B-13) is available as TEP-G (trade name) manufactured by ASAHI YUKIZAI CORPORATION.

The compound of Formula (B-14) is EPOLEAD GT401 (trade name) manufactured by Daicel Corporation, in which a, b, c, and d each are 0 or 1 and a+b+c+d=1.

The compound of Formula (B-15) is available as TEPIC-SS (trade name) manufactured by Nissan Chemical Industries, Ltd.

The compound of Formula (B-16) is available as EX-411 (trade name) manufactured by Nagase ChemteX Corporation.

The compound of Formula (B-17) is available as EX-521 (trade name) manufactured by Nagase ChemteX Corporation.

The compound of Formula (B-18) is available as YH-434L (trade name) manufactured by NIPPON STEEL & SUMIKIN CHEMICAL CO., LTD.

The compound of Formula (B19) is available as EX-711 (trade name) manufactured by Nagase ChemteX Corporation.

The compound of Formula (B20) is available as YD-4032D (trade name) manufactured by DIC Corporation.

The compound of Formula (B-21) is available as HP-4770 (trade name) manufactured by DIC Corporation.

The compound of Formula (B-22) is available as YH-434L (trade name) manufactured by NIPPON STEEL & SUMIKIN CHEMICAL CO., LTD.

The compound of Formula (B-23) is available as a reagent.

The compound of Formula (B-24) is available as RE-81 ONM (trade name) manufactured by Nippon Kayaku Co., Ltd.

The compound of Formula (B-25) is available as FAE-2500 (trade name) manufactured by Nippon Kayaku Co., Ltd.

The compound of Formula (B-26) is available as NC-6000 (trade name) manufactured by Nippon Kayaku Co., Ltd.

EPICLON HP-6000 (weight per epoxy equivalent 244 g/eq.) manufactured by DIC Corporation is also usable.

The epoxy compound (C) containing an unsaturated bond between carbon atoms used in the present invention can be exemplified below.

Formula (C-1)

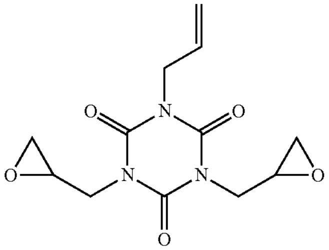

Formula (C-2)

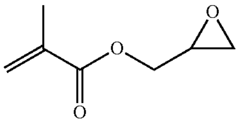

-continued

Formula (C-3)

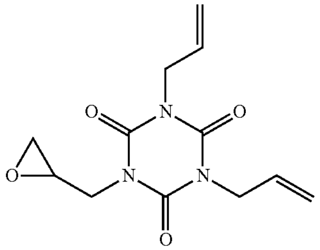

The compound of Formula (C-1) is available as MA-DGIC (trade name) manufactured by SHIKOKU CHEMICALS CORPORATION.

The compound of Formula (C-3) is available as DA-MGIC (trade name) manufactured by SHIKOKU CHEMICALS CORPORATION.

Other compounds can be obtained as reagents.

The proton-generating compound (D) used in the present invention can be exemplified below.

Formula (D-1)

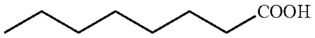

Formula (D-2)

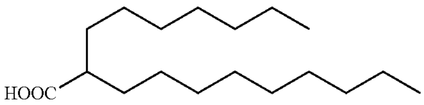

Formula (D-3)

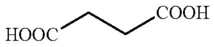

Formula (D-4)

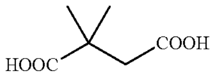

Formula (D-5)

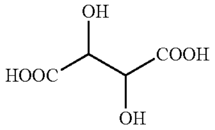

Formula (D-6)

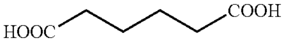

Formula (D-7)

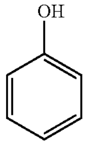

Formula (D-8)

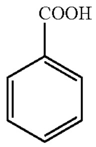

Formula (D-9)

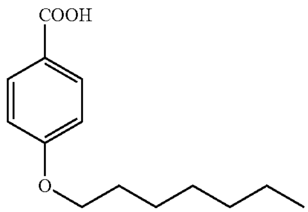

-continued
Formula (D-10)
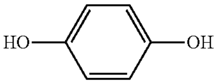
Formula (D-11)
Formula (D-12)
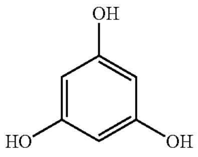
Formula (D-13)
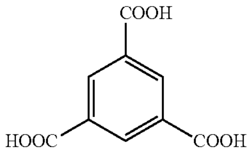
Formula (D-14)
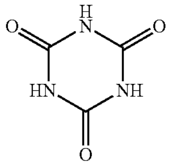
Formula (D-15)
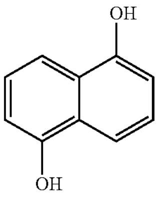
Formula (D-16)
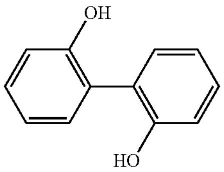
Formula (D-17)
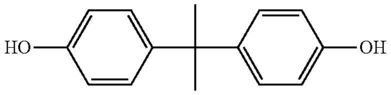
Formula (D-18)
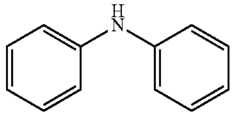
Formula (D-19)
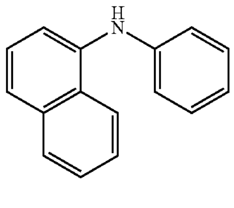
-continued
Formula (D-20)
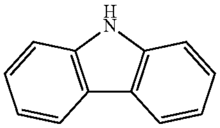
Formula (D-21)
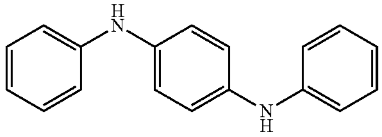
Formula (D-22)
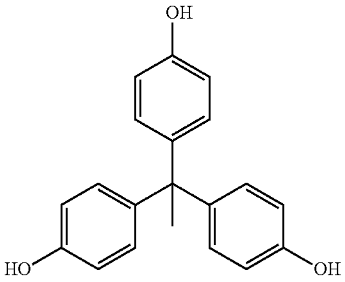
Formula (D-23)
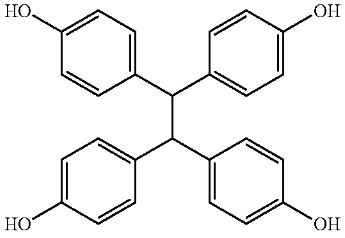
Formula (D-24)
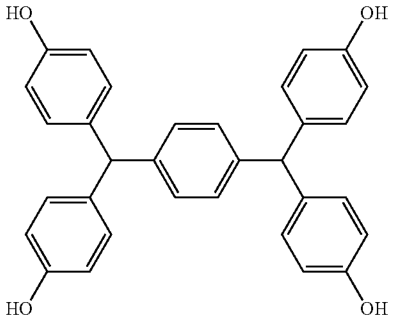
Formula (D-25)
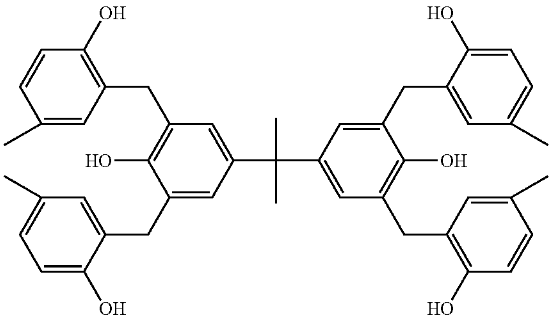

-continued
Formula (D-26)
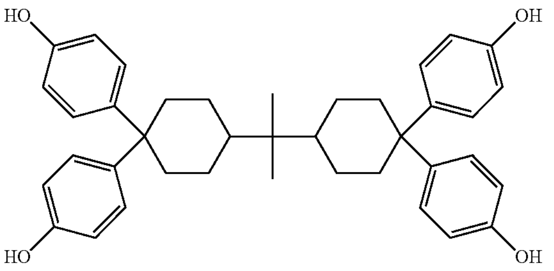
Formula (D-27)
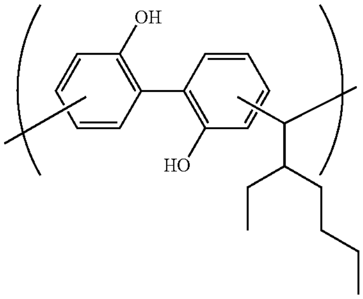
Formula (D-28)
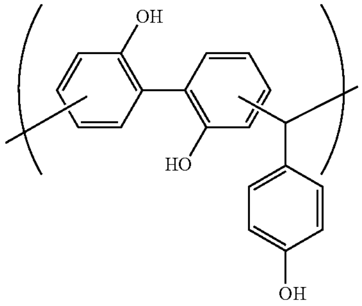
Formula (D-29)
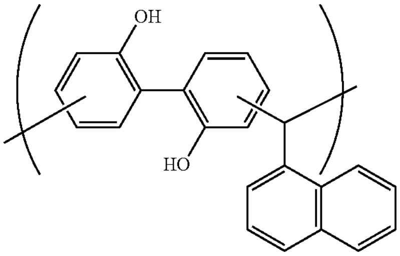
Formula (D-30)
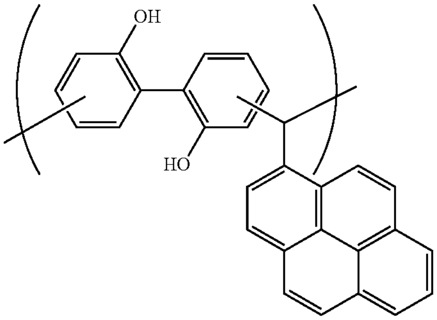
-continued
Formula (D-31)
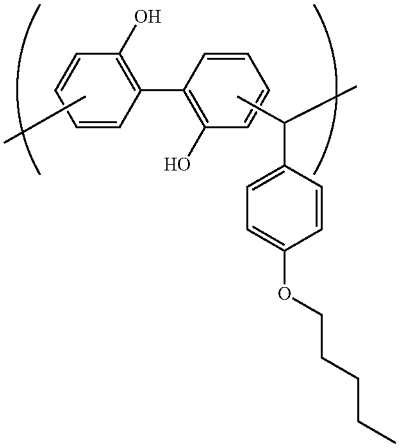
Formula (D-32)
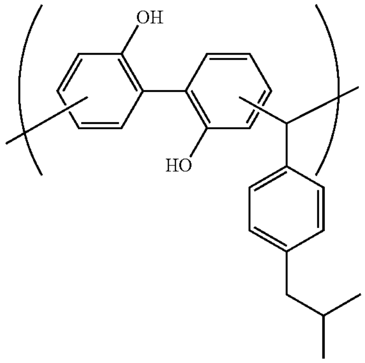
Formula (D-33)
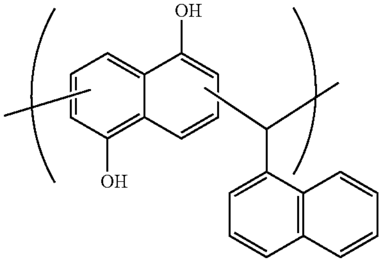
Formula (D-34)
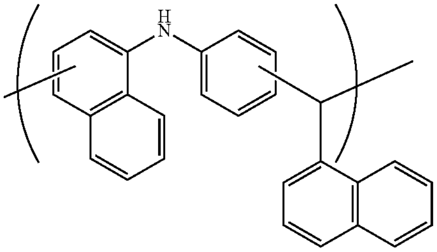
Formula (D-35)
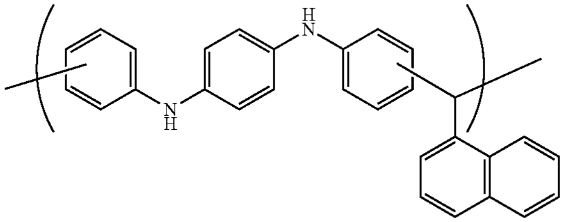

-continued

Formula (D-36)

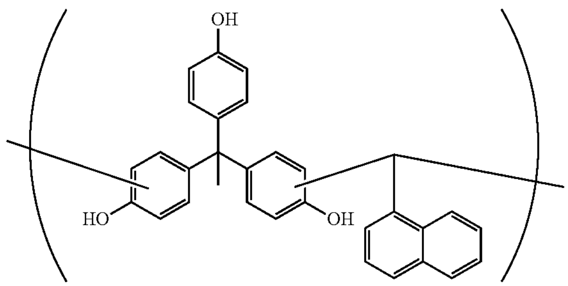

Formula (D-37)

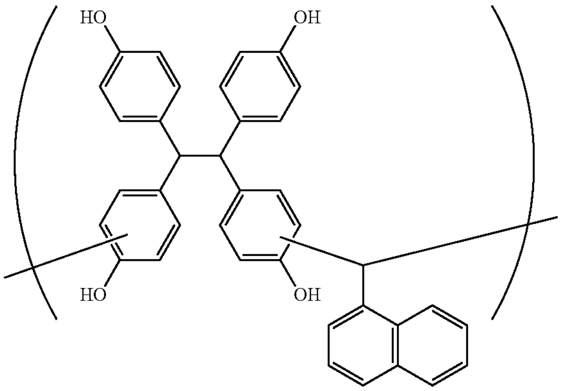

Formula (D-38)

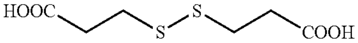

The above compounds can be obtained as reagents.

The compound of Formula (D-23) is available as TEP-DF (trade name) manufactured by ASAHI YUKIZAI CORPORATION.

The compound of Formula (D-24) is available as TEP-TPA (trade name) manufactured by ASAHI YUKIZAI CORPORATION.

The compound of Formula (D-25) is available as TEPC-BIP-A (trade name) manufactured by ASAHI YUKIZAI CORPORATION.

The compound of Formula (D-26) is available as TEP-BOCP (trade name) manufactured by ASAHI YUKIZAI CORPORATION.

In the present invention, the compound (E) has the hydroxy group of the partial structure (II). A part of the hydroxy groups can be reacted with the compound (G) containing an unsaturated bond between carbon atoms and capable of reacting with the hydroxy group. Photoreactivity is improved due to the reaction of the compound (G). In consideration of this reaction, in the compound (E), the proportion of the partial structure (I) and the partial structure (II) is also desirably in the range of a molar ratio of $0.01 \leq$(Partial structure (II))/(Partial structure (I)+Partial structure (II))$\leq 0.8$.

The compound (G) may be an acid halide compound, an acid anhydride, an isocyanate compound, and an alkyl halide compound containing an unsaturated bond between carbon and carbon or the proton-generating compound (A) containing an unsaturated bond between the carbon atoms.

The compound (G) can be exemplified below.

Formula (G-1)

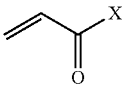

Formula (G-2)

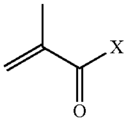

Formula (G-3)

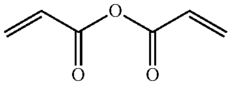

Formula (G-4)

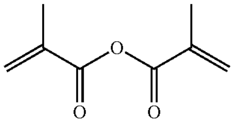

Formula (G-5)

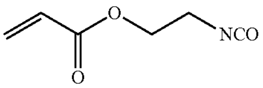

Formula (G-6)

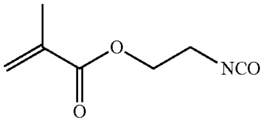

Formula (G-7)

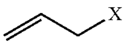

Formula (G-8)

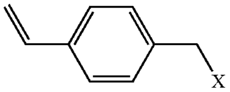

In the above formulas, X is a halogen atom such as fluorine, chlorine, bromine, and iodine. For example, X in Formula (G-1) is preferably a chlorine atom, X in Formula (G-2) is preferably a chlorine atom, X in Formula (G-7) is preferably a bromine atom, and X in Formula (G-8) is preferably a chlorine atom. The above compounds can be obtained as reagents.

The compound (E) used in the present invention can be exemplified below.

Formula (E-1)
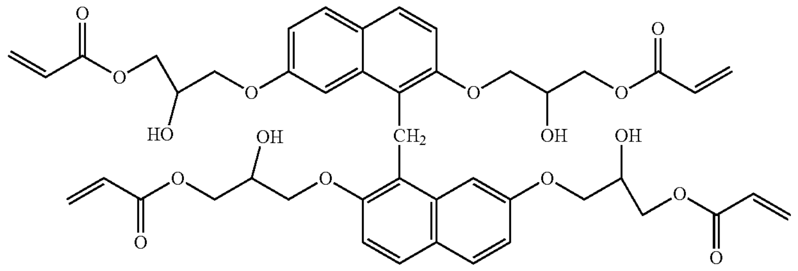
Formula (E-2)
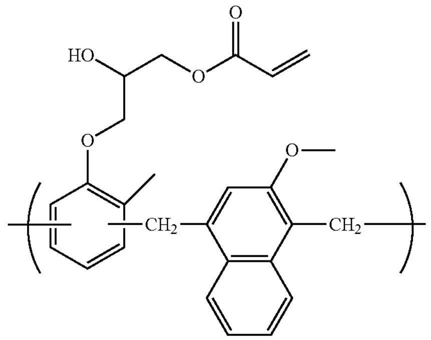
Formula (E-3)
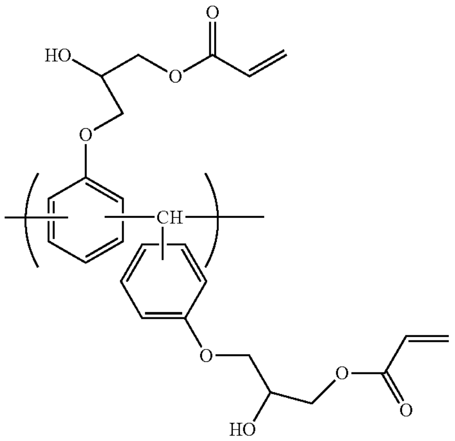
Formula (E-4)
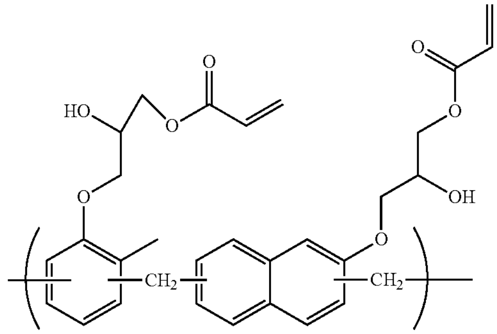
Formula (E-5)
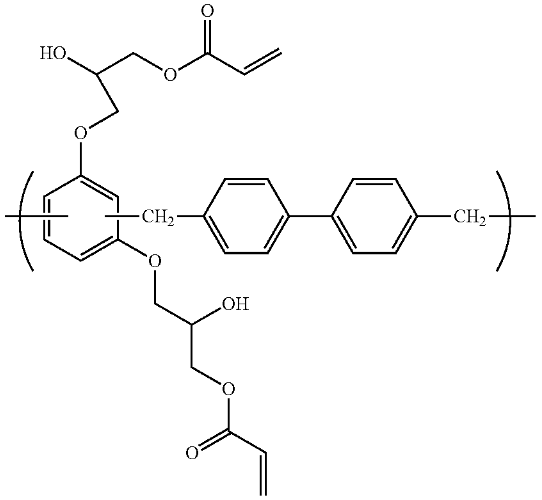
Formula (E-6)
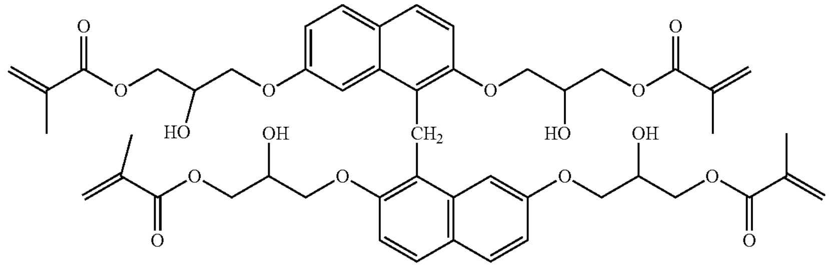

-continued
Formula (E-7)
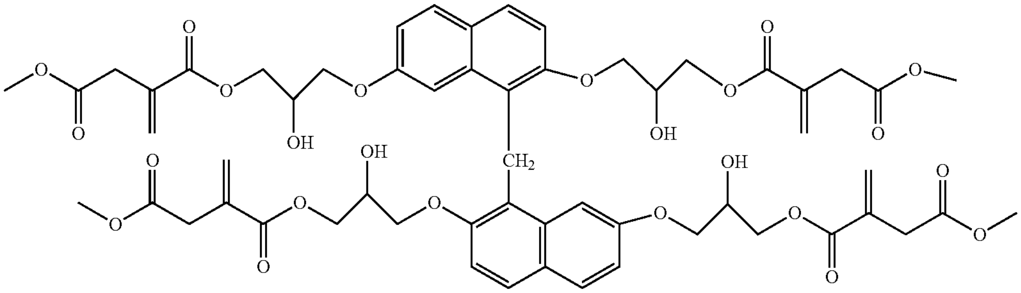
Formula (E-8)
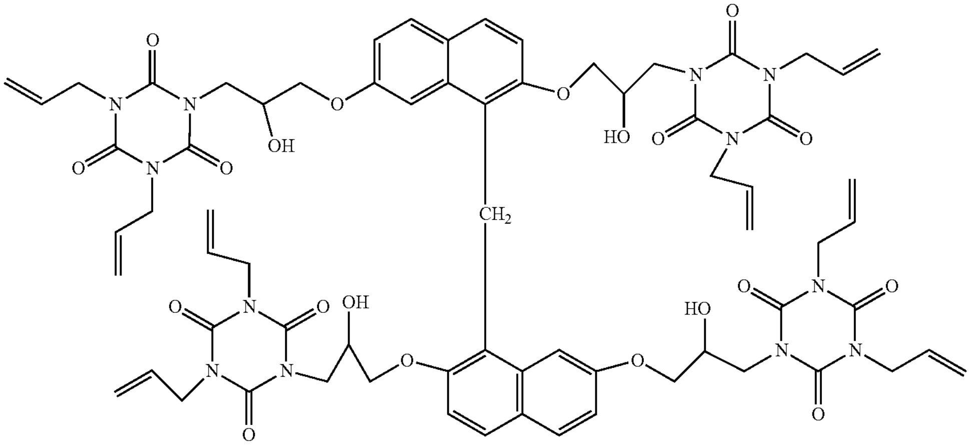
Formula (E-9)
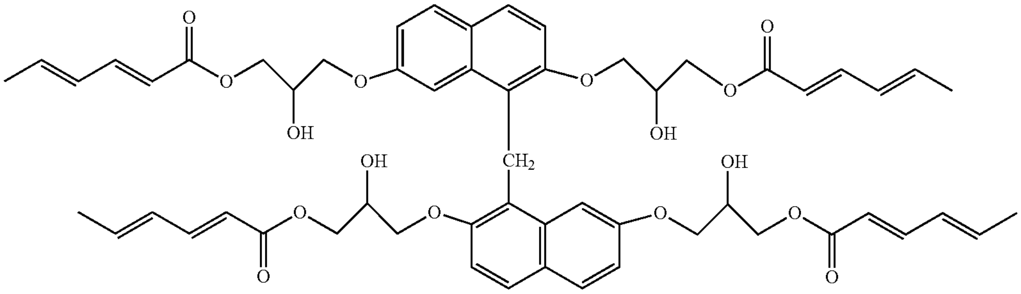
Formula (E-10)
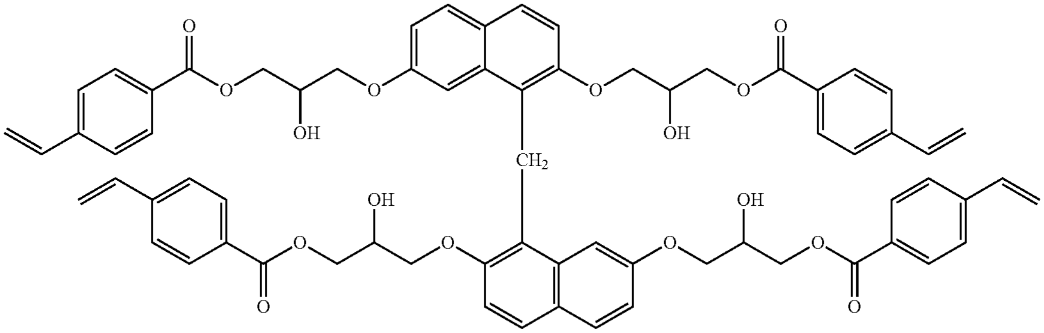

-continued
Formula (E-11)
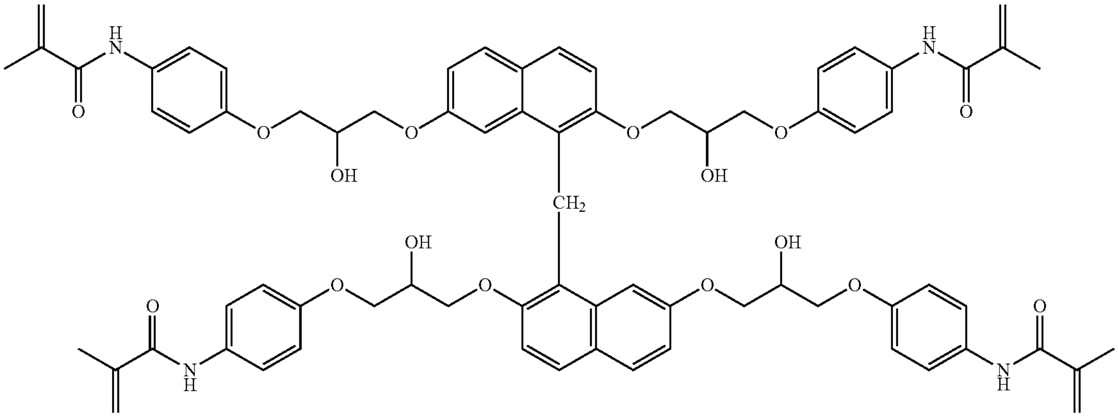
Formula (E-12)
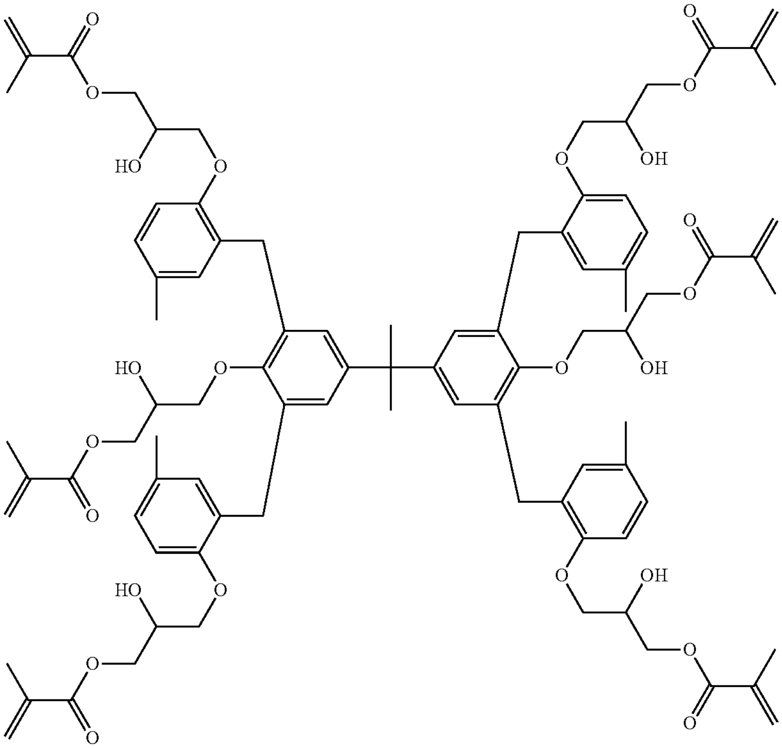
Formula (E-13)
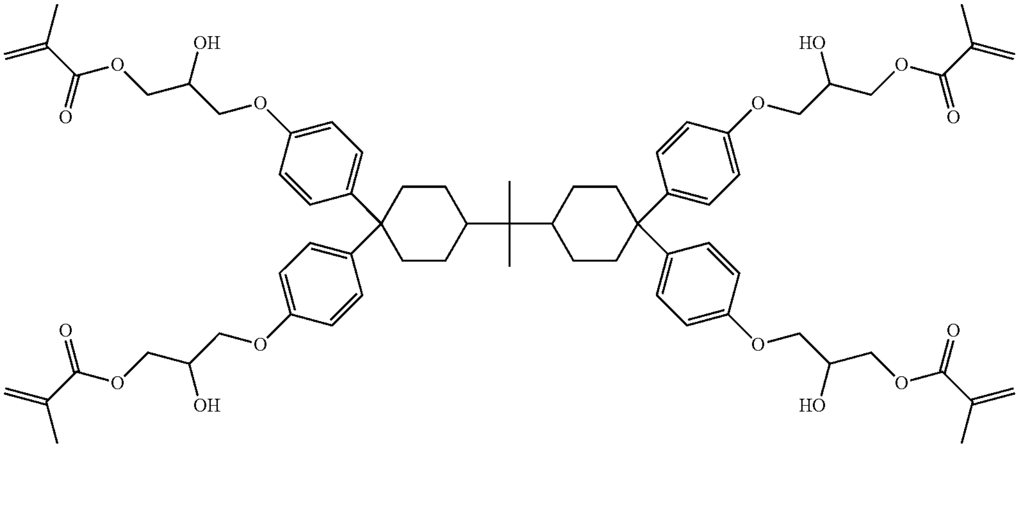

-continued
Formula (E-14)
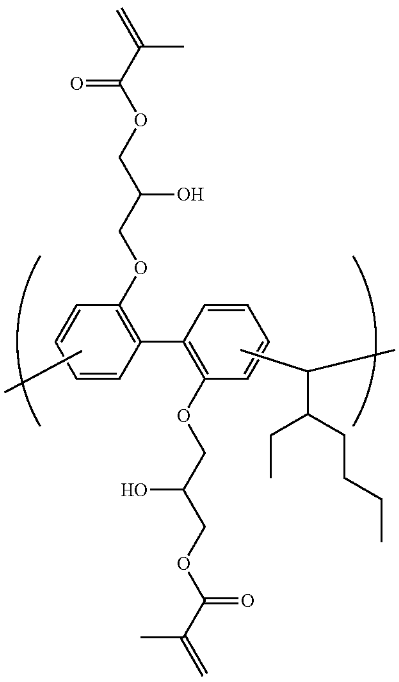
Formula (E-15)
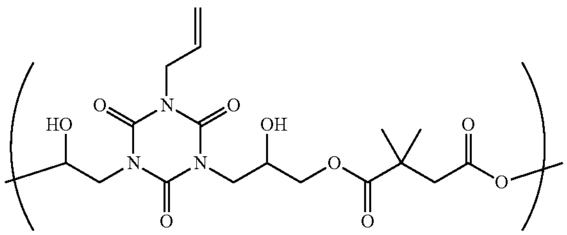
Formula (E-16)
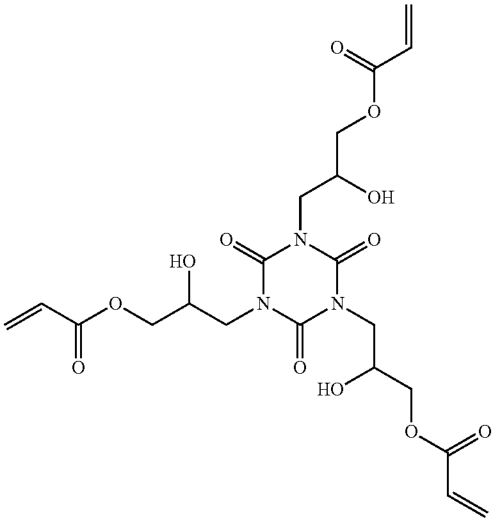
Formula (E-17)
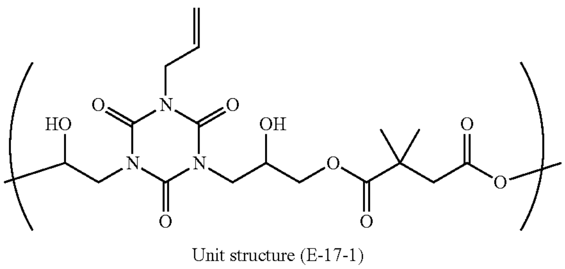
Unit structure (E-17-1)
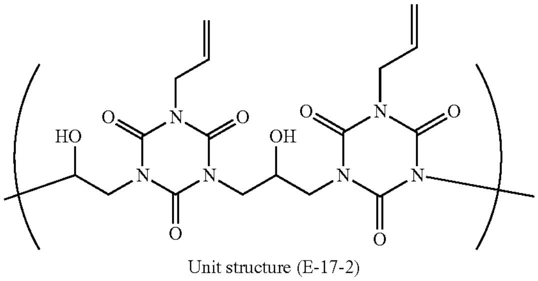
Unit structure (E-17-2)

In Formula (E-17), the proportion of the unit structure (E-17-1) and the unit structure (E-17-2) is in a molar ratio of 60:40.

Formula (E-18)

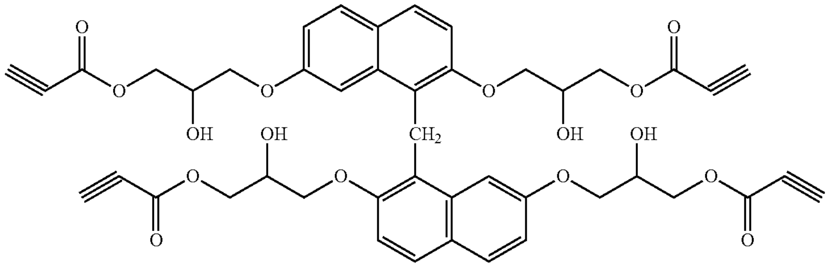

Formula (E-19)

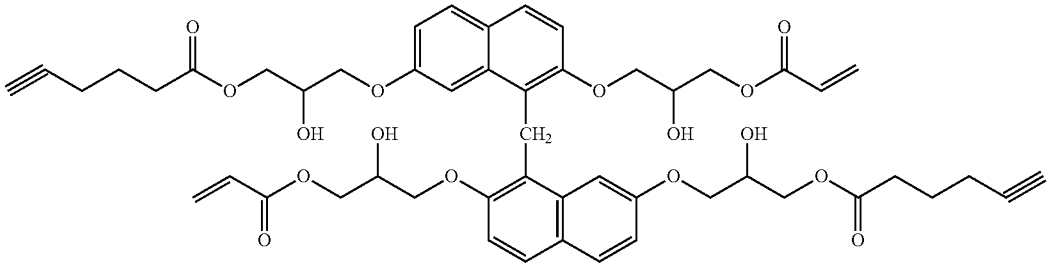

Formula (E-20)

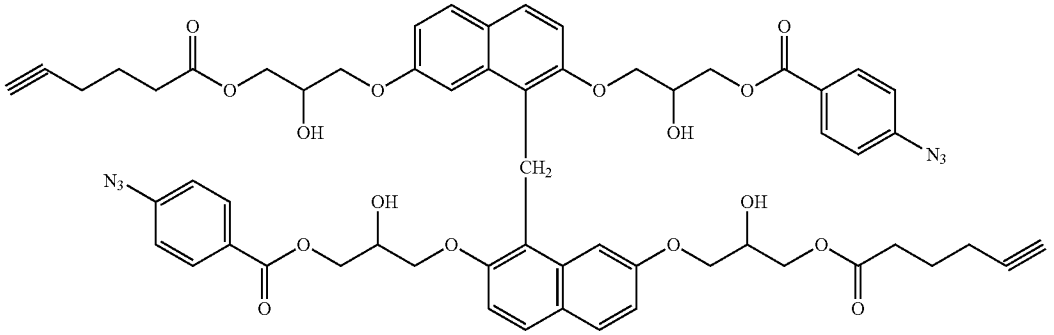

Formula (E-21)

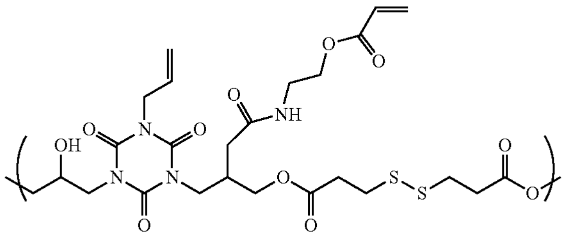

Formula (E-22)

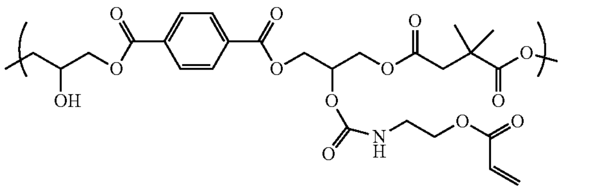

The stepped substrate coating composition of the present invention may include a surfactant. Examples of the surfactant may include nonionic surfactant such as polyoxyethylene alkyl ethers including polyoxyethylene lauryl ethers, polyoxyethylene stearyl ethers, polyoxyethylene cetyl ethers, and polyoxyethylene oleyl ethers; polyoxyethylene alkylaryl ethers including polyoxyethylene octylphenyl ethers and polyoxyethylene nonylphenyl ethers; polyoxyethylene-polyoxypropylene block copolymers; sorbitan fatty acid esters including sorbitan monolaurates, sorbitan monopalmitates, sorbitan monostearates, sorbitan monooleates, sorbitan trioleates, and sorbitan tristearates; and polyoxyethylene sorbitan fatty acid esters including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorine-based surfactants such as EFTOP [registered trademark] EF301, EF303, and EF352 (manufactured by Mitsubishi Materials Electronic Chemicals Co., Ltd.), Megafac [registered trademark] F171, F173, R30, R-30N, and R-40LM (manufactured by DIC Corporation), Fluorad FC430 and FC431 (manufactured by Sumitomo 3M Ltd.), Asahi guard [registered trademark] AG710, Surflon [registered trademark] S-382, SC101, SC102, SC103, SC104, SC105, and SC106 (manufactured by Asahi Glass Co., Ltd.); and Organosiloxane Polymer KP341 (manufactured by Shin-Etsu Chemical Co., Ltd.). One kind of the surfactant selected from these surfactants may be added or two or more kinds of the surfactants may be added in combination. The content ratio of the surfactant is, for example, 0.01% by mass to 5% by mass relative to the solid content obtained by removing the solvent described below from the stepped substrate coating composition of the present invention.

In the present invention, examples of usable solvents dissolving the compound (E) include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal butyl ketone, isopropyl acetate ketone, normal-propyl acetate, isobutyl acetate, methanol, ethanol, isopropanol (2-propanol), tert-butanol, allyl alcohol, normal-propanol, 2-methyl-2-butanol, isobutanol, normal-butanol, 2-methyl-1-butanol, 1-pentanol, 2-methyl-1-pentanol, 2-ethylhexanol, isopropyl ether, 1,4-dioxane, N,N-dimethylformamide, N,N-dimethylacetamide, N-methylpyrrolidone, 1,3-dimethyl-2-imidazolidinone, dimethylsulfoxide, and N-cyclohexyl-2-pyrrolidinone. These solvents can be used singly or in combination of two or more of them.

Subsequently, a method for forming the planarization film using the stepped substrate coating composition of the present invention will be described. The stepped substrate coating composition is applied onto a substrate (for example, silicon/silicon dioxide coating, a glass substrate and a transparent substrate such as an ITO substrate) used for producing precision integrated circuit elements by an appropriate application method such as a spinner and a coater and thereafter the applied composition is baked (heated) and undergoes exposure to light to form a coated film. In other words, the method includes (i) applying the stepped substrate coating composition to a substrate having a step, and (ii) performing exposure of the applied composition to light to produce the coated substrate.

When the stepped substrate coating composition is applied using a spinner, the composition can be applied, for example, in conditions of a rotation number of 100 to 5,000 for 10 seconds to 180 seconds.

The substrate having the open area (non-pattern area) and the pattern areas of DENCE (dense) and ISO (coarse) and having an aspect ratio of the pattern of 0.1 to 10 can be used.

The non-pattern area refers to a part where no pattern (for example, a hole or a trench structure) exists on the substrate, DENCE (dense) refers to a part where patterns are dense on the substrate, and ISO (coarse) refers to a part where the intervals between patterns are wide and the pattern is scattered on the substrate. The aspect ratio of the pattern refers to the ratio of the depth of the pattern to the width of the pattern. The pattern depth is usually several hundreds of nm (for example, about 100 nm to about 300 nm). DENCE (dense) is a place where patterns of about several tens of nm (for example, 30 nm to 80 nm) are densely packed at intervals of about 100 nm. ISO (coarse) is a place where patterns of several hundreds of nm (for example, about 200 nm to about 1,000 nm) are scattered.

Here, the film thickness of the stepped substrate coated film (planarization film) is preferably 0.01 μm to 3.0 μm. As the step (ia), heating can be performed after the application and the condition of the heating is 70° C. to 400° C. or 100° C. to 250° C. for 10 seconds to 5 minutes or 30 seconds to 2 minutes. This heating allows the stepped substrate coating composition to reflow to form a flat stepped substrate coated film (planarization film).

The exposure light in the step (ii) is actinic rays such as near ultraviolet rays, far ultraviolet rays, or extreme ultraviolet rays (for example, EUV, wavelength 13.5 nm). Light having a wavelength of, for example, 248 nm (KrF laser light), 193 nm (ArF laser light), 172 rim (xenon excimer light), or 157 rim ($F_2$ laser light) is used. Ultraviolet light having an exposure wavelength of 150 rim to 248 nm can be used and ultraviolet light having a wavelength of 172 run can be preferably used.

By this exposure to light, the stepped substrate coated film (planarization film) is crosslinked. The exposure amount in the step (ii) may be 10 $mJ/cm^2$ to 3,000 $mJ/cm^2$. Photoreaction occurs at the exposure amount in this range, crosslinking is formed, and solvent resistance is developed.

The thus formed stepped substrate coated film (planarization film) desirably has Bias (coating step) between the open area and the pattern areas of zero. The stepped substrate coated film, however, can be planarized so that Bias is in a range of 1 nm to 50 nm or 1 nm to 25 nm. Bias between the open area and the DENCE area is about 15 nm to about 20 rim and Bias between the open area and the ISO area is about 1 nm to about 10 nm.

The stepped substrate coated film (planarization film) obtained according to the present invention is covered with a resist film, a resist pattern is formed by exposing and developing the resist film by lithography, and the substrate can be processed in accordance with the resist pattern. In that case, the stepped substrate coated film (planarization film) is a resist underlayer film and the stepped substrate coating composition is also a resist underlayer film-forming composition.

A resist is applied onto the resist underlayer film, irradiated with light or electron beams through a predetermined mask, developed, rinsed, and dried, whereby an excellent resist pattern can be obtained. Post Exposure Bake (PEB) with light or electron beams can also be carried out, if necessary. The part of the resist underlayer film where the resist film is removed by the previous process is removed by dry etching to allow a desired pattern to be formed on the substrate.

The resist used in the present invention is a photoresist and an electron beam resist.

As the photoresist applied on the upper part of the resist underlayer film for lithography of the present invention, both negative photoresist and positive photoresist can be used. Examples of the resists include a positive photoresist made of a novolac resin and 1,2-naphthoquinonediazidesulfonate, a chemically amplified photoresist made of a binder having a group that increases an alkali dissolution rate by decomposing with an acid and a photoacid generator, a chemically amplified photoresist made of an alkali-soluble binder, a low molecular weight compound that increases an alkali dissolution rate of the photoresist by decomposing with an acid, and a photoacid generator, a chemically amplified photoresist made of a binder having a group that increases an alkali dissolution rate by decomposing with an acid, a low molecular weight compound that increases an alkali dissolution rate of the photoresist by decomposing with an acid, and a photoacid generator, and a photoresist having Si atoms in the skeleton of the molecule. Specific examples may include APEX-E (trade name, manufactured by Rohm and Haas Inc.).

Examples of the electron beam resist applied onto the upper part of the resist underlayer film for lithography of the present invention may include a composition made of a resin containing Si-Si bonds in the main chain and containing aromatic rings at its ends and an acid generator generating an acid by irradiation with electron beams and a composition made of poly(p-hydroxystyrene) in which hydroxy groups are substituted with organic groups including N-carboxyamine and an acid generator generating an acid by irradiation with electron beams. In the latter electron beam resist composition, the acid generated from the acid generator by the electron beam irradiation is reacted with the N-carboxyaminoxy groups of the polymer side chain and the polymer side chain is decomposed into a hydroxy group to exhibit alkali solubility. Consequently, the resist composition is dissolved into an alkali development liquid to form a resist pattern. Examples of the acid generator generating the acid by electron beam irradiation may include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as triphenylsulfonium salts and diphenyliodonium salts, and sulfonates such as nitrobenzyltosylate and dinitrobenzyltosylate.

The exposure light for the photoresist is actinic rays such as near ultraviolet rays, far ultraviolet rays, or extreme ultraviolet rays (for example, EUV, wavelength 13.5 inn) and, for example, light having a wavelength of 248 nm (KrF laser light), 193 nm (ArF laser light), or 157 nm ($F_2$ laser light) is used. The light irradiation can be used without limitation as long as the acid can be generated from the photoacid generator in the resist film. The exposure amount is 1 $mJ/cm^2$ to 3,000 $mJ/cm^2$, 10 $mJ/cm^2$ to 3,000 $mJ/cm^2$, or 10 $mJ/cm^2$ to 1,000 $mJ/cm^2$.

The electron beam irradiation to the electron beam resist can be carried out by, for example, using an electron beam irradiation device.

As the development liquid for the resist film having the resist underlayer film formed by using the resist underlayer film-forming composition for lithography of the present invention, the following aqueous alkali solutions can be used. The aqueous alkali solutions includes solutions of inorganic alkalis such as sodium hydroxide, potassium hydroxide, sodium carbonate, sodium silicate, sodium metasilicate, and aqueous ammonia; solutions of primary amines such as ethylamine and n-propylamine; solutions of secondary amines such as diethylamine and di-n-butylamine; solutions of tertiary amines such as triethylamine and methyldiethylamine; solutions of alcoholamines such as dimethylethanolamine and triethanolamine; solutions of quaternary ammonium salt such as tetramethylammonium hydroxide, tetraethylammonium hydroxide, and choline; and solutions of cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, aqueous solutions of the quaternary ammonium salts are preferable and aqueous solutions of tetraethylammonium hydroxide and choline are further preferable.

As the development liquid, an organic solvent can be used. Examples of the solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxypropionate, ethyl-2-hydroxypropionate, methyl-3-methoxypropionate, ethyl-3-methoxypropionate, ethyl-3-ethoxypropionate, and propyl-3-methoxypropionate. A surfactant or the like may be further added to the development liquid. The conditions for the development are appropriately selected from a temperature of 5° C. to 50° C. and a time of 10 seconds to 600 seconds.

In the present invention, a semiconductor device can be produced through the steps of forming a resist underlayer film by using the resist underlayer film-forming composition onto a semiconductor substrate; forming a resist film thereon; forming a resist pattern by irradiation with light or electron beams and development; etching the resist underlayer film using the formed resist pattern; and processing the semiconductor substrate by using the patterned resist underlayer film.

When the formation of the finer resist pattern will be progressed in the future, the problem of resolution and the problem of resist pattern collapse after development will arise and thus formation of a thinner resist film will be desired. Consequently, the resist pattern thickness sufficient for substrate processing is difficult to secure. As a result, a process in which not only the resist pattern but also the resist underlayer film formed between the resist film and the semiconductor substrate to be processed has the function as a mask at the time of the substrate processing has been required. As the resist underlayer film for such a process, a resist underlayer film for lithography having the selectivity of dry etching rate close to that of the resist film, a resist underlayer film for lithography having the selectivity of dry etching rate lower than that of the resist film, or a resist underlayer film for lithography having the selectivity of dry etching rate lower than that of the semiconductor substrate, which is different from conventional resist underlayer films having high etch rate properties, has been required. Such a resist underlayer film can be provided with the function of anti-reflective properties and thus can also have the function of an anti-reflective coating.

On the other hand, in order to obtain a fine resist pattern, a process has been also started to be used in which the resist pattern and the resist underlayer film at the time of resist underlayer film dry etching are formed narrower than the pattern width at the time of resist development. As the resist underlayer film for such a process, the resist underlayer film having the selectivity of dry etching rate close to that of the resist film, which is different from conventional high etching rate anti-reflective coatings, has been required. Such a resist underlayer film can be provided with the function of anti-reflective properties and thus can also have the function of an anti-reflective coating.

In the present invention, after the resist underlayer film of the present invention is formed onto the substrate, the resist can be applied directly onto the resist underlayer film or after a film made of a single layer or several layers of coating material is formed onto the resist underlayer film, the resist can be applied. Even when the pattern width of the resist film is narrow as a consequence and the resist film is thinly covered in order to prevent pattern collapse, the substrate can be processed by selecting an appropriate etching gas.

More specifically, the semiconductor device can be produced through the steps of forming a resist underlayer film using the resist underlayer film-forming composition on a semiconductor substrate; forming a hard mask thereon using a coating material including a silicon component and the like or a hard mask (for example, silicon nitride oxide) by vapor deposition; further forming a resist film thereon; forming a resist pattern by irradiation with light or electron beams and development; etching the hard mask using the resist pattern with a halogen-based gas; etching the resist underlayer film using the patterned hard mask with an oxygen-based gas or a hydrogen-based gas; and processing the semiconductor substrate using the patterned resist underlayer film with the halogen-based gas.

In consideration of the effect as the anti-reflective coating, the resist underlayer film-forming composition for lithography of the present invention contains a light absorption site in the skeleton and thus no substances are diffused into the photoresist at the time of drying by heating. The light absorption site has sufficiently high light absorption properties and thus has a high anti-reflection effect.

The resist underlayer film-forming composition for lithography of the present invention has high heat stability, prevents contamination to the upper layer film caused by decomposed substances at the time of baking, and can provide an extra temperature margin during the baking process.

Depending on process conditions, the resist underlayer film-forming composition for lithography of the present invention can be used as a film that has the anti-reflection function and further has functions of preventing interaction between the substrate and the photoresist or preventing adverse effect on the substrate due to the materials used for the photoresist or substances generated at the time of exposure of the photoresist to light.

EXAMPLES

Synthesis Example 1

To 10.00 g of an epoxy group-containing benzene fused ring compound (product name: EPICLON HP-4700, weight per epoxy equivalent: 165 g/eq., manufactured by DIC Corporation, Formula (B-12)), 4.37 g of acrylic acid, 0.56 g of ethyltriphenylphosphonium bromide, and 0.03 g of hydroquinone, 34.91 g of propylene glycol monomethyl ether was added and the resultant mixture was heated and stirred under nitrogen atmosphere at 100° C. for 21 hours. To the obtained solution, 15 g of a cation exchange resin (product name: Dowex [registered trademark] 550A, manufactured by Muromachi Technos Co., Ltd.) and 15 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-1) and the weight average molecular weight Mw measured by GPC in terms of polystyrene was 1,400. No residual epoxy group existed and the molar ratio of (Partial structure (II))/(Partial structure (I)+Partial structure (II)) was 0.5.

Synthesis Example 2

To 14.00 g of an epoxy group-containing benzene fused ring compound (product name: EPICLON HP-5000, weight per epoxy equivalent: 252 g/eq., manufactured by DIC Corporation, Formula (B-1)), 4.00 g of acrylic acid, 0.52 g of ethyltriphenylphosphonium bromide, and 0.02 g of hydroquinone, 43.27 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-2) and the weight average molecular weight Mw measured by GPC in terms of polystyrene was 1,300. No residual epoxy group existed and the molar ratio of (Partial structure (II))/(Partial structure (I)+Partial structure (II)) was 0.5.

Synthesis Example 3

To 13.00 g of an epoxy group-containing benzene fused ring compound (product name: EPPN-50111, weight per epoxy equivalent: 167 g/eq., manufactured by Nippon Kayaku Co., Ltd, Formula (B-4)), 5.61 g of acrylic acid, 0.72 g of ethyltriphenylphosphonium bromide, and 0.03 g of hydroquinone, 45.30 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-3) and the weight average molecular weight Mw measured by GPC in terms of polystyrene was 1,400. No residual epoxy group existed and the molar ratio of (Partial structure (II))/(Partial structure (I)+Partial structure (II)) was 0.5.

Synthesis Example 4

To 14.00 g of an epoxy group-containing benzene fused ring compound (product name: NC-3500, weight per epoxy equivalent: 207 g/eq., manufactured by Nippon Kayaku Co., Ltd, Formula (B-9)), 4.87 g of acrylic acid, 0.63 g of ethyltriphenylphosphonium bromide, and 0.03 g of hydroquinone, 45.57 g of propylene glycol monomethyl ether was added and the resultant mixture was heated and stirred under nitrogen atmosphere at 100° C. for 22 hours. To the obtained solution, 20 g of a cation exchange resin (product name: Dowex [registered trademark] 550A, manufactured by Muromachi Technos Co., Ltd.) and 20 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-5) and the weight average molecular weight Mw measured by GPC in terms of polystyrene was 3,300. No residual epoxy group existed and the molar ratio of (Partial structure (II))/(Partial structure (I)+Partial structure (II)) was 0.5.

Synthesis Example 5

To 14.00 g of an epoxy group-containing benzene fused ring compound (product name: NC-7300L, weight per epoxy equivalent: 231 g/eq., manufactured by Nippon Kayaku Co., Ltd, Formula (B-8)), 4.71 g of acrylic acid, 0.60 g of ethyltriphenylphosphonium bromide, and 0.03 g of hydroquinone, 45.09 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-4) and the weight average molecular weight Mw measured by GPC in teinis of polystyrene was 900. No residual epoxy group existed and the molar ratio of (Partial structure (II))/(Partial structure (I)+Partial structure (II)) was 0.5.

Synthesis Example 6

To 10.00 g of an epoxy group-containing benzene fused ring compound (product name: EPICLON HP-4700, weight per epoxy equivalent: 165 g/eq., manufactured by DIC Corporation, Formula (B-12)), 5.22 g of acrylic acid, 0.56 g of ethyltriphenylphosphonium bromide, and 0.03 g of hydroquinone, 36.90 g of propylene glycol monomethyl ether was added and the resultant mixture was heated and stirred under nitrogen atmosphere at 100° C. for 21 hours. To the obtained solution, 16 g of a cation exchange resin (product name: Dowex [registered trademark] 550A, manufactured by Muromachi Technos Co., Ltd.) and 16 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-6) and the weight average molecular weight Mw measured by GPC in terms of polystyrene was 1,400. No residual epoxy group existed and the molar ratio of (Partial structure (II))/(Partial structure (I)+Partial structure (II)) was 0.5.

Synthesis Example 7

To 10.00 g of an epoxy group-containing benzene fused ring compound (product name: EPICLON HP-4700, weight per epoxy equivalent: 165 g/eq., manufactured by DIC Corporation, Formula (B-12)), 8.74 g of monomethyl itaconate, 0.56 g of ethyltriphenylphosphonium bromide, and 0.03 g of hydroquinone, 45.09 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-7) and the weight average molecular weight Mw measured by GPC in terms of polystyrene was 1,600. No residual epoxy group existed and the molar ratio of (Partial structure (II))/(Partial structure (I)+Partial structure (II)) was 0.5.

Synthesis Example 8

To 8.00 g of an epoxy group-containing benzene fused ring compound (product name: EPICLON HP-4700, weight per epoxy equivalent: 165 g/eq., manufactured by DIC Corporation, Formula (13-12)), 10.14 g of diallyl isocyanurate, 0.45 g of ethyltriphenylphosphonium bromide, and 0.02 g of hydroquinone, 43.43 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-8) and the weight average molecular weight Mw measured by GPC in terms of polystyrene was 1,600. No residual epoxy group existed and the molar ratio of (Partial structure (II))/(Partial structure (I)+Partial structure (II)) was 0.34.

Synthesis Example 9

To 11.00 g of an epoxy group-containing benzene fused ring compound (product name: EPICLON HP-4700, weight per epoxy equivalent: 165 g/eq., manufactured by DIC Corporation, Formula (B-12)), 7.48 g of sorbic acid, 0.62 g of ethyltriphenylphosphonium bromide, and 0.03 g of hydroquinone, 44.62 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-9) and the weight average molecular weight Mw measured by GPC in terms of polystyrene was 1,600. No residual epoxy group existed and the molar ratio of (Partial structure (II))/(Partial structure (I)+Partial structure (II)) was 0.5.

Synthesis Example 10

To 8.00 g of an epoxy group-containing benzene fused ring compound (product name: EPICLON HP-4700, weight per epoxy equivalent: 165 g/eq., manufactured by DIC Corporation, Formula (B-12)), 7.34 g of 4-vinylbenzoic acid, 0.46 g of ethyltriphenylphosphonium bromide, and 0.03 g of hydroquinone, 36.92 g of propylene glycol monomethyl ether was added and the resultant mixture was heated and stirred under nitrogen atmosphere at 100° C. for 21 hours. To the obtained solution, 16 g of a cation exchange resin (product name: Dowex [registered trademark] 550A, manufactured by Muromachi Technos Co., Ltd.) and 16 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-10) and the weight average molecular weight Mw measured by GPC in terms of polystyrene was 1,500. No residual epoxy group existed and the molar ratio of (Partial structure (II))/(Partial structure (I)+Partial structure (II)) was 0.5.

Synthesis Example 11

To 9.00 g of an epoxy group-containing benzene fused ring compound (product name: EPICLON HP-4700, weight per epoxy equivalent: 162 g/eq., manufactured by DIC Corporation, Formula (B-12)), 9.84 g of N-(4-hydroxyphenyl)methacrylamide, 1.04 g of ethyltriphenylphosphonium bromide, and 0.02 g of hydroquinone, 45.22 g of propylene glycol monomethyl ether was added and the resultant mixture was heated and stirred under nitrogen atmosphere at 100° C. for 25 hours. To the obtained solution, 20 g of a cation exchange resin (product name: Dowex [registered trademark] 550A, manufactured by Muromachi Technos Co., Ltd.) and 20 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-11) and the weight average molecular weight Mw measured by GPC in terms of polystyrene was 1,900. No residual epoxy group existed and the molar ratio of (Partial structure (II))/(Partial structure (I)+Partial structure (II)) was 0.5.

Synthesis Example 12

To 14.00 g of an epoxy group-containing benzene fused ring compound (product name: EPICLON HP-6000, weight per epoxy equivalent: 239 g/eq., manufactured by DIC Corporation), 4.24 g of acrylic acid, 0.54 g of ethyltriphenylphosphonium bromide, and 0.03 g of hydroquinone, 43.89 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. A weight average molecular weight Mw of the obtained compound measured by GPC in terms of polystyrene was 800. No residual epoxy group existed and the molar ratio of (Partial structure (II))/(Partial structure (I)+Partial structure (II)) was 0.1.

Synthesis Example 13

To 7.00 g of an epoxy group-containing benzene fused ring compound (product name: EPICLON HP-6000, weight per epoxy equivalent: 239 g/eq., manufactured by DIC Corporation), 5.21 g of N-(4-hydroxyphenyl)methacrylamide, 0.54 g of ethyltriphenylphosphonium bromide, and 0.02 g of hydroquinone, 39.74 g of propylene glycol monomethyl ether acetate was added and the resultant mixture was heated and stirred under nitrogen atmosphere at 100° C. for 23 hours. To this resultant mixture, 4.60 g of methacrylic anhydride was added and the obtained mixture was further heated and stirred at 100° C. for 22 hours. To the obtained solution, 17 g of a cation exchange resin (product name: Dowex [registered trademark] 550A, manufactured by Muromachi Technos Co., Ltd.) and 17 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. A weight average molecular weight Mw of the obtained compound measured by GPC in terms of polystyrene was 1,100. No residual epoxy group existed and the molar ratio of (Partial structure (II))/(Partial structure (I)+Partial structure (II)) was 0.1.

Synthesis Example 14

To 9.00 g of an epoxy group-containing benzene fused ring compound (product name: EPICLON HP-6000, weight per epoxy equivalent: 238 g/eq., manufactured by DIC Corporation), 2.72 g of acrylic acid, 0.35 g of ethyltriphenylphosphonium bromide, and 0.02 g of hydroquinone, 41.84 g of propylene glycol monomethyl ether acetate was added and the resultant mixture was heated and stirred under nitrogen atmosphere at 100° C. for 23 hours. To this resultant mixture, 5.83 g of methacrylic anhydride was added and the obtained mixture was further heated and stirred at 100°

C. for 22 hours. To the obtained solution, 18 g of a cation exchange resin (product name: Dowex [registered trademark] 550A, manufactured by Muromachi Technos Co., Ltd.) and 18 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. A weight average molecular weight Mw of the obtained compound measured by GPC in terms of polystyrene was 800. No residual epoxy group existed and the molar ratio of (Partial structure (II))/(Partial structure (I)+Partial structure (II)) was 0.1.

Synthesis Example 15

To 10.00 g of a bisphenol derivative (product name: TEPC-BIP-A, manufactured by ASAHI YUKIZAI CORPORATION), 12.05 g of glycidyl methacrylate, 1.57 g of ethyltriphenylphosphonium bromide, and 0.04 g of hydroquinone, 55.32 g of propylene glycol monomethyl ether was added and the resultant mixture was heated and stirred under nitrogen atmosphere at 100° C. for 24 hours. To the obtained solution, 24 g of a cation exchange resin (product name: Dowex [registered trademark] 550A, manufactured by Muromachi Technos Co., Ltd.) and 24 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-12) and the weight average molecular weight Mw measured by GPC in terms of polystyrene was 1,700. No residual epoxy group existed and the molar ratio of (Partial structure (II))/(Partial structure (I)+Partial structure (II)) was 0.5.

Synthesis Example 16

To 12.00 g of a hydrogenated bisphenol derivative (product name: TEP-BOOP, manufactured by ASAHI YUKIZAI CORPORATION), 11.83 g of glycidyl methacrylate, 1.54 g of ethyltriphenylphosphonium bromide, and 0.04 g of hydroquinone, 59.29 g of propylene glycol monomethyl ether was added and the resultant mixture was heated and stirred under nitrogen atmosphere at 100° C. for 24 hours. To the obtained solution, 25 g of a cation exchange resin (product name: Dowex [registered trademark] 550A, manufactured by Muromachi Technos Co., Ltd.) and 25 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-13) and the weight average molecular weight Mw measured by GPC in terms of polystyrene was 1,800. No residual epoxy group existed and the molar ratio of (Partial structure (II))/(Partial structure (I)+Partial structure (II)) was 0.5.

Synthesis Example 17

To 30.00 g of 2,2'-biphenol, 20.66 g of 2-ethylhexylaldehyde, and 7.74 g of methanesulfonic acid, 47.78 g of propylene glycol monomethyl ether was added and the resultant mixture was heated and stirred under reflux under a nitrogen atmosphere for 17 hours. After 39.82 g of propylene glycol monomethyl ether was added to the obtained solution to dilute the resultant mixture, 58 g of a cation exchange resin (product name: DOWEX [registered trademark] 550A, manufactured by Muromachi Technos Co., Ltd.) and 58 g of an anion exchange resin (product name: Amberlite [registered trademark] 15JWET, manufactured by ORGANO CORPORATION) were added and the resultant mixture was ion-exchanged at room temperature for 4 hours. The solution from which the ion exchange resin was separated was dropped into water to precipitate the product. The precipitated product was separated and thereafter depressurized at 60° C. The obtained compound (D) corresponded to the compound of Formula (D-27) and the weight average molecular weight Mw measured by GPC in terms of polystyrene was 2,500.

To 5.00 g of the compound of Formula (D-27), 5.26 g of glycidyl methacrylate, 0.69 g of ethyltriphenylphosphonium bromide, and 0.02 g of hydroquinone, 25.58 g of propylene glycol monomethyl ether acetate was added and the resultant mixture was heated and stirred under nitrogen atmosphere at 100° C. for 22 hours. To the obtained solution, 11 g of a cation exchange resin (product name: Dowex [registered trademark] 550A, manufactured by Muromachi Technos Co., Ltd.) and 11 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-14) and the weight average molecular weight Mw measured by GPC in terms of polystyrene was 3,700. No residual epoxy group existed and the molar ratio of (Partial structure (II))/(Partial structure (I)+Partial structure (II)) was 0.5.

Synthesis Example 18

To 7.00 g of monoallyl diglycidyl isocyanurate (product name: MA-DGIC, weight per epoxy equivalent: 140 g/eq., manufactured by SHIKOKU CHEMICALS CORPORATION, Formula (C-1)), 3.64 g of dimethylsuccinic acid, 0.65 g of ethyltriphenylphosphonium bromide, and 0.16 g of hydroquinone, 45.86 g of propylene glycol monomethyl ether was added and the resultant mixture was heated and stirred under reflux conditions under nitrogen atmosphere for 15 hours. To the obtained solution, 11 g of a cation exchange resin (product name: Dowex [registered trademark] 550A, manufactured by Muromachi Technos Co., Ltd.) and 11 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-15) and the weight average molecular weight Mw measured by GPC in terms of polystyrene was 2,100. No residual epoxy group existed and the molar ratio of (Partial structure (II))/(Partial structure (I)+Partial structure (II)) was 0.67.

Synthesis Example 19

To 11.00 g of an epoxy group-containing heterocyclic compound (product name: TEPIC-SS, weight per epoxy equivalent: 100 g/eq., manufactured by Nissan Chemical Industries, Ltd, Formula (B-15)), 7.95 g of acrylic acid, 1.02 g of ethyltriphenylphosphonium bromide, and 0.05 g of hydroquinone, 46.70 g of propylene glycol monomethyl ether was added and the resultant mixture was heated and stirred under nitrogen atmosphere at 100° C. for 19 hours. To the obtained solution, 20 g of a cation exchange resin (product name: Dowex [registered trademark] 550A, manufactured by Muromachi Technos Co., Ltd.) and 20 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-16) and the weight average molecular weight Mw measured by GPC in terms of polystyrene was 400. No residual epoxy group existed and the molar ratio of (Partial structure (II))/(Partial structure (I)+Partial structure (II)) was 0.5.

Synthesis Example 20

Into a two-necked flask, 6.00 g of an epoxy group-containing benzene fused ring compound (product name: EPICLON HP-4700, weight per epoxy equivalent: 165 g/eq., manufactured by DIC Corporation, Formula (B-12)), 2.60 g of propiolic acid (manufactured by Tokyo Chemical Industry Co., Ltd.), 0.34 g of ethyltriphenylphosphonium bromide (manufactured by HOKKO CHEMICAL INDUSTRY CO., LTD.), and 0.03 g of hydroquinone (manufactured by Tokyo Chemical Industry Co., Ltd.) were charged and 20.91 g of propylene glycol monomethyl ether was added. The resultant mixture was heated and stirred under nitrogen atmosphere at 100° C. for 1 hour. To the obtained solution, 9.0 g of a cation exchange resin (product name: Dowex [registered trademark] 550A, manufactured by Muromachi Technos Co., Ltd.) and 9.0 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (E) corresponded to the compound of Formula (E-18) and the weight average molecular weight Mw measured by GPC in terms of polystyrene was 1,300. No residual epoxy group existed and the molar ratio of (Partial structure (II))/(Partial structure (I)+Partial structure (II)) was 0.5.

Synthesis Example 21

Into a two-necked flask, 4.50 g of an epoxy group-containing benzene fused ring compound (product name: EPICLON HP-4700, weight per epoxy equivalent: 165 gleq., manufactured by DIC Corporation, Formula (B-12)), 1.00 g of acrylic acid (manufactured by Tokyo Chemical Industry Co., Ltd.), 1.56 g of 5-hexynoic acid (manufactured by Tokyo Chemical Industry Co., Ltd.), 0.26 g of ethyltriphenylphosphonium bromide (manufactured by HOKKO CHEMICAL INDUSTRY CO., LTD.), and 0.02 g of hydroquinone (manufactured by Tokyo Chemical Industry Co., Ltd.) were charged and 17.11 g of propylene glycol monomethyl ether was added. The resultant mixture was heated and stirred under nitrogen atmosphere at I00° C. for 11 hours. To the obtained solution, 7.3 g of a cation exchange resin (product name: Dowex [registered trademark] 550A, manufactured by Muromachi Technos Co., Ltd.) and 7.3 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (E) corresponded to the compound of Formula (E-19) and the weight average molecular weight Mw measured by GPC in terms of polystyrene was 1,400. No residual epoxy group existed and the molar ratio of (Partial structure (II))/(Partial structure (I)+Partial structure (II)) was 0.5.

Synthesis Example 22

Into a two-necked flask, 4.50 g of an epoxy group-containing benzene fused ring compound (product name: EPICLON HP-4700, weight per epoxy equivalent: 165 g/eq., manufactured by DIC Corporation, Formula (B-12)), 2.27 g of 4-azidobenzoic acid (manufactured by Tokyo Chemical Industry Co., Ltd.), 1.56 g of 5-hexynoic acid (manufactured by Tokyo Chemical Industry Co., Ltd.), 0.52 g of ethyltriphenylphosphonium bromide (manufactured by HOKKO CHEMICAL INDUSTRY CO., LTD.), and 0.02 g of hydroquinone (manufactured by Tokyo Chemical Industry Co., Ltd.) were charged and 20.66 g of propylene glycol monomethyl ether was added. The resultant mixture was heated and stirred under nitrogen atmosphere at 80° C. for 5 hours. To the obtained solution, 8.9 g of a cation exchange resin (product name: Dowex [registered trademark] 550A, manufactured by Muromachi Technos Co., Ltd.) and 8.9 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (E) corresponded to the compound of Formula (E-20) and the weight average molecular weight Mw measured by GPC in terms of polystyrene was 1,900. No residual epoxy group existed and the molar ratio of (Partial structure (II))/(Partial structure (I)+Partial structure (II)) was 0.67.

Synthesis Example 23

To 20.00 g of monoallyldiglycidyl isocyanurate (product name: MA-DGIC, weight per epoxy equivalent: 140 g/eq., manufactured by SHIKOKU CHEMICALS CORPORATION, Formula (C-1)), 16.50 g of 3,3'-dithiopropionic acid, and 1.32 g of ethyltriphenylphosphonium bromide, 151.30 g of cyclohexanone was added and the resultant mixture was heated and stirred under nitrogen atmosphere at 105° C. for 24 hours. Thereafter, 20.15 g of 2-isocyanatoethyl acrylate (product name: Karenz AOI [registered trademark], manufactured by Showa Denko K.K.) was further added and the resultant mixture was heated and stirred at 70° C. for 24 hours with dry air being flowed. To the obtained solution, 58 g of a cation exchange resin (product name: Dowex [registered trademark] 550A, manufactured by Muromachi Technos Co., Ltd.) and 58 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-21) and the weight average molecular weight Mw measured by GPC in terms of polystyrene was 3,500. No residual epoxy group existed and the molar ratio of (Partial structure (II))/(Partial structure (1)+Partial structure (II)) was 0.24.

Synthesis Example 24

To 20.00 g of diglycidyl terephthalate (product name: Denacol EX-711, weight per epoxy equivalent: 147 g/eq., manufactured by Nagase ChemteX Corporation, Formula (B-19)), 11.82 g of dimethylsuccinic acid, and 1.31 g of ethyltriphenylphosphonium bromide, 132.51 g of cyclohexanone was added and the resultant mixture was heated and stirred under nitrogen atmosphere at 105° C. for 24 hours. Thereafter, 19.85 g of 2-isocyanatoethyl acrylate (product name: Karenz AOI [registered trademark], manufactured by Showa Denko K.K.) was further added and the resultant mixture was heated and stirred at 70° C. for 24 hours with dry air being flowed. To the obtained solution, 53 g of a cation exchange resin (product name: Dowex [registered trademark] 550A, manufactured by Muromachi Technos Co., Ltd.) and 53 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (E) was obtained. The obtained compound (E) corresponded to the compound of Formula (E-22) and the weight average molecular weight Mw measured by GPC in terms of polystyrene was 5,000. No residual epoxy group existed and the molar ratio of (Partial structure (II))/(Partial structure (I)+Partial structure (II)) was 0.18.

Comparative Synthesis Example 1

To 12.00 g of an epoxy group-containing benzene fused ring compound (product name: EPICLON HP-4700, weight per epoxy equivalent: 165 g/eq., manufactured by DIC Corporation, Formula (B-12)), 6.26 g of crotonic acid, 0.68 g of ethyltriphenylphosphonium bromide, and 0.03 g of hydroquinone, 44.26 g of propylene glycol monomethyl ether was added and the resultant mixture was heated and stirred under nitrogen atmosphere at 100° C. for 22 hours. To the obtained solution, 19 g of a cation exchange resin (product name: Dowex [registered trademark] 550A, manufactured by Muromachi Technos Co., Ltd.) and 19 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (F) was obtained. The obtained compound (F) corresponded to the compound of Formula (F-1) and the weight average molecular weight Mw measured by GPC in terms of polystyrene was 1,300. No residual epoxy group existed and the molar ratio of (Partial structure (II))/(Partial structure (I)+Partial structure (II)) was 1.0.

Formula (F-1)

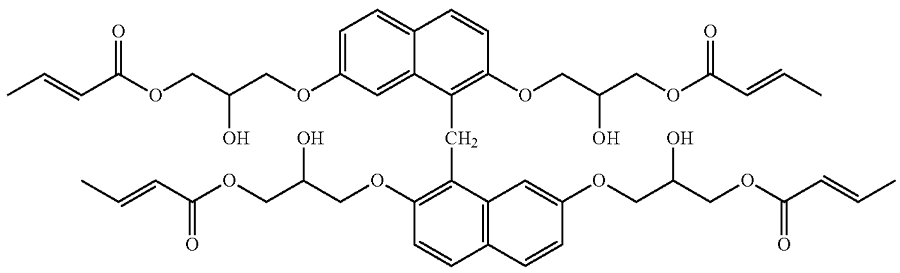

Comparative Synthesis Example 2

To 11.00 g of an epoxy group-containing benzene fused ring compound (product name: EPICLON HP-4700, weight per epoxy equivalent: 165 g/eq., manufactured by DIC Corporation, Formula (B-12)), 6.67 g of tiglic acid, 0.62 g of ethyltriphenylphosphonium bromide, and 0.03 g of hydroquinone, 42.75 g of propylene glycol monomethyl ether was added and the resultant mixture was heated and stirred under nitrogen atmosphere at 100° C. for 22 hours. To the obtained solution, 18 g of a cation exchange resin (product name: Dowex [registered trademark] 550A, manufactured by Muromachi Technos Co., Ltd.) and 18 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (F) was obtained. The obtained compound (F) corresponded to the compound of Formula (F-2) and the weight average molecular weight Mw measured by GPC in terms of polystyrene was 1,400. No residual epoxy group existed and the molar ratio of (Partial structure (II))/(Partial structure (I)+Partial structure (II)) was 1.0.

Formula (F-2)

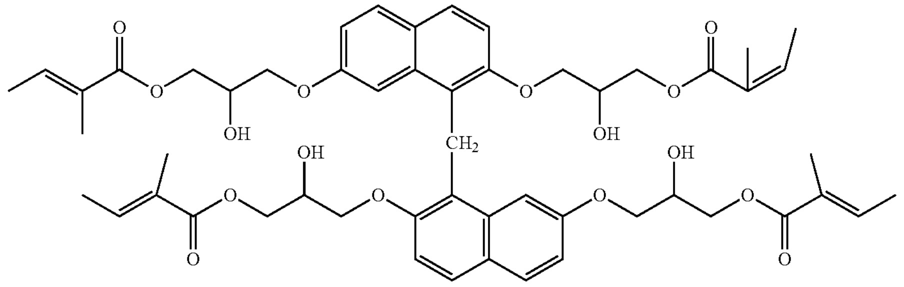

Comparative Synthesis Example 3

To 10.00 g of an epoxy group-containing benzene fused ring compound (product name: EPICLON HP-4700, weight per epoxy equivalent: 165 g/eq., manufactured by DIC Corporation, Formula (B-12)), 7.88 g of monomethyl maleate, 0.56 g of ethyltriphenylphosphonium bromide, and 0.03 g of hydroquinone, 43.10 g of propylene glycol monomethyl ether was added and the resultant mixture was heated and stirred under nitrogen atmosphere at 100° C. for 22 hours. To the obtained solution, 18 g of a cation exchange resin (product name: Dowex [registered trademark] 550A, manufactured by Muromachi Technos Co., Ltd.) and 18 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (F) was obtained. The obtained compound (F) corresponded to the compound of Formula (F-3) and the weight average molecular weight Mw measured by GPC in terms of polystyrene was 1,900. No residual epoxy group existed and the molar ratio of (Partial structure (II))/(Partial structure (I)+Partial structure (II)) was 1.0.

Comparative Synthesis Example 4

To 7.50 g of an epoxy group-containing benzene fused ring compound (product name: EPICLON HP-4700, weight per epoxy equivalent: 165 g/eq., manufactured by DIC Corporation, Formula (13-12)), 8.10 g of 4-methoxycinnamic acid, 0.42 g of ethyltriphenylphosphonium bromide, and 0.03 g of hydroquinone, 37.44 g of propylene glycol monomethyl ether was added and the resultant mixture was heated under reflux under nitrogen atmosphere for 17 hours. To the obtained solution, 16 g of a cation exchange resin (product name: Dowex [registered trademark] 550A, manufactured by Muromachi Technos Co., Ltd.) and 16 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (F) was obtained. The obtained compound (F) corresponded to the compound of Formula (F-4) and the weight average molecular weight Mw measured by GPC in terms of polystyrene was 1,700. No residual epoxy group existed and the molar ratio of (Partial structure (II))/(Partial structure (I)+Partial structure (II)) was 1.0.

Formula (F-3)

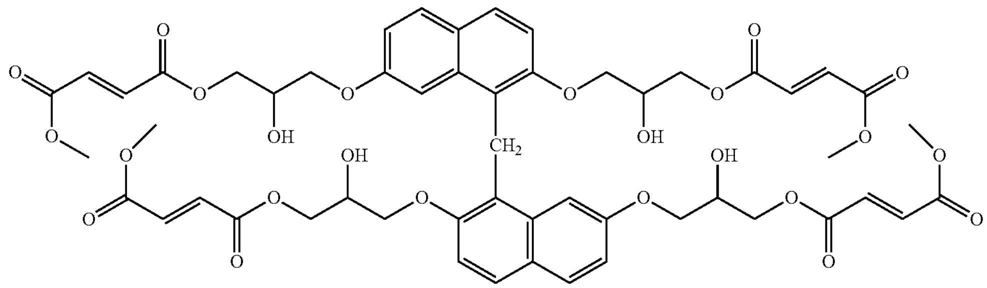

Formula (F-4)

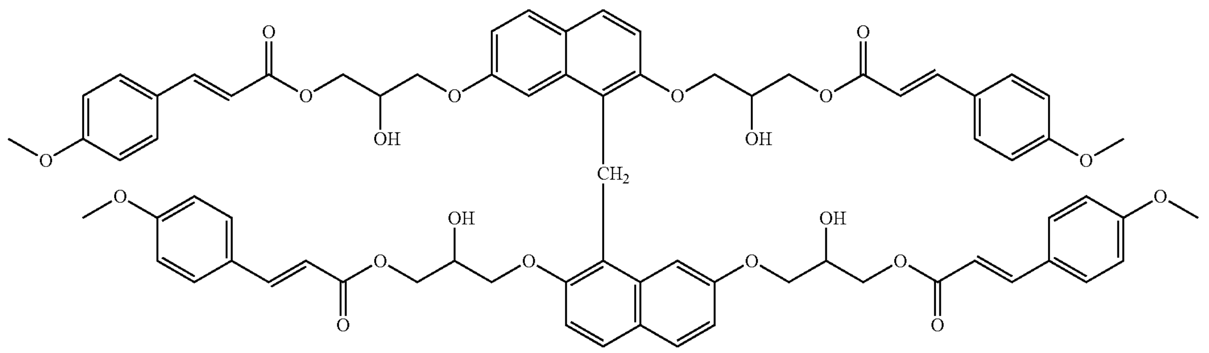

Comparative Synthesis Example 5

To 5.00 g of an epoxy group-containing aliphatic polyether (product name: EHPE-3150, weight per epoxy equivalent: 179 g/eq., manufactured by Daicel Corporation, Formula (B-11)), 3.11 g of 9-anthracene carboxylic acid, 2.09 g of benzoic acid, and 0.62 g of ethyltriphenylphosphonium bromide, 7.57 g of propylene glycol monomethyl ether and 17.67 g of propylene glycol monomethyl ether acetate were added and the resultant mixture was heated under reflux under nitrogen atmosphere for 13 hours. To the obtained solution, 16 g of a cation exchange resin (product name: Dowex [registered trademark] 550A, manufactured by Muromachi Technos Co., Ltd.) and 16 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of the compound (F) was obtained. The obtained compound (F) corresponded to the compound of Formula (F-5) and the weight average molecular weight Mw measured by GPC in terms of polystyrene was 4,700. No residual epoxy group existed and the molar ratio of (Partial structure (II))/(Partial structure (I)+Partial structure (II)) was 1.0.

Formula (F-5)

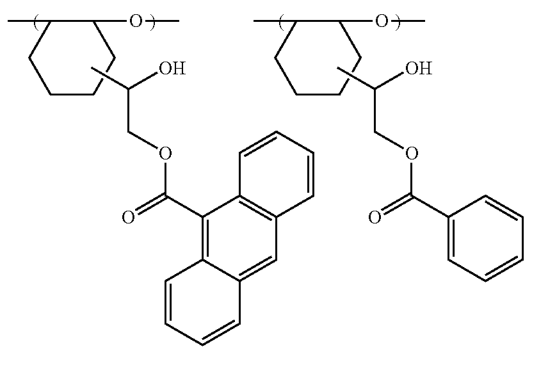

Comparative Synthesis Example 6

Into a two-necked flask, 7.80 g of an epoxy group-containing benzene fused ring compound (product name: EPICLON HP-4700, weight per epoxy equivalent: 165 g/eq., manufactured by DIC Corporation, Formula (B-12)), 5.40 g of 5-hexynoic acid (manufactured by Tokyo Chemical Industry Co., Ltd.), 0.45 g of ethyltriphenylphosphonium bromide (manufactured by HOKKO CHEMICAL INDUSTRY CO., LTD.), and 0.03 g of hydroquinone (manufactured by Tokyo Chemical Industry Co., Ltd.) were charged and 31.91 g of propylene glycol monomethyl ether was added. The resultant mixture was heated and stirred under nitrogen atmosphere at 100° C. for 25.5 hours. To the obtained solution, 13.7 g of a cation exchange resin (product name: Dowex [registered trademark] 550A, manufactured by Muromachi Technos Co., Ltd.) and 13.7 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (F) corresponded to the compound of Formula (F-6) and the weight average molecular weight Mw measured by GPC in terms of polystyrene was 1,550. No residual epoxy group existed and the molar ratio of (Partial structure (II))/(Partial structure (I)+Partial structure (II)) was 1.0.

Formula (F-6)

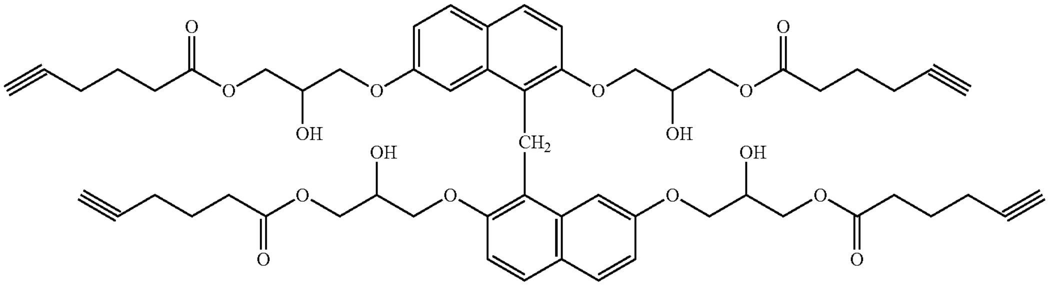

Comparative Synthesis Example 7

Into a two-necked flask, 6.50 g of an epoxy group-containing benzene fused ring compound (product name: EPICLON HP-4700, weight per epoxy equivalent: 165 g/eq., manufactured by DIC Corporation, Formula (B-12)), 1.45 g of acrylic acid (manufactured by Tokyo Chemical Industry Co., Ltd.), 0.37 g of ethyltriphenylphosphonium bromide (manufactured by HOKKO CHEMICAL INDUSTRY CO., LTD.), and 0.02 g of hydroquinone (manufactured by Tokyo Chemical Industry Co., Ltd.) were charged and 19.46 g of propylene glycol monomethyl ether was added. The resultant mixture was heated and stirred under nitrogen atmosphere at 100° C. for 11 hours. To the obtained solution, 8.3 g of a cation exchange resin (product name: Dowex [registered trademark] 550A, manufactured by Muromachi Teclinos Co., Ltd.) and 8.3 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (F) corresponded to the compound of Formula (F-7) and the weight average molecular weight Mw measured by GPC in terms of polystyrene was 1,700. (Epoxy group)/(Hydroxy group) was 1.0 mole and the molar ratio of (Partial structure (II))/(Partial structure (I)+Partial structure (II)) was 0.5.

Comparative Synthesis Example 8

Into a two-necked flask, 5.50 g of an epoxy group-containing benzene fused ring compound (product name: EPICLON HP-4700, weight per epoxy equivalent: 165 g/eq., manufactured by DIC Corporation, Formula (B-12)), 2.77 g of 4-azidobenzoic acid (manufactured by Tokyo Chemical Industry Co., Ltd.), 0.32 g of ethyltriphenylphosphonium bromide (manufactured by HOKKO CHEMICAL INDUSTRY CO., LTD.), and 0.02 g of hydroquinone (manufactured by Tokyo Chemical Industry Co., Ltd.) were charged and 20.08 g of propylene glycol monomethyl ether was added. The resultant mixture was heated and stirred under nitrogen atmosphere at 100° C. for 15 hours. To the obtained solution, 8.6 g of a cation exchange resin (product name: Dowex [registered trademark] 550A, manufactured by Muromachi Technos Co., Ltd.) and 8.6 g of an anion exchange resin (product name: Amberlite [registered trademark] 15JWET, manufactured by ORGANO CORPORATION) were added and the resultant mixture was ion-exchanged at room temperature for 4 hours. After the ion exchange resins were separated, a solution of a compound was obtained. The obtained compound (F) corresponded to the compound of Formula (F-8) and the weight average molecular weight Mw measured by GPC in terms of polystyrene was 1,100. The molar ratio of (Epoxy group)/(Hydroxy group) was 1.0 and the molar ratio of (Partial structure (II))/(Partial structure (I)+Partial structure (II)) was 1.0.

Formula (F-7)

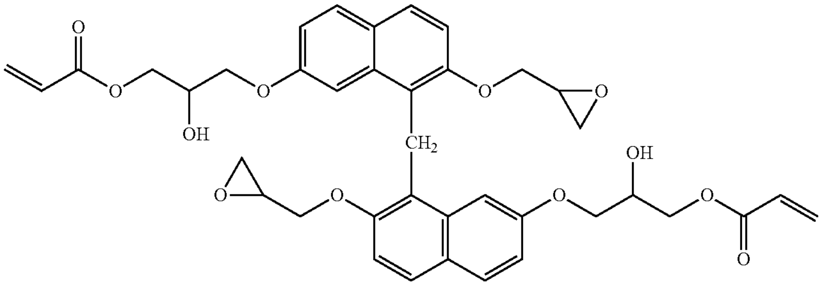

Formula (F-8)

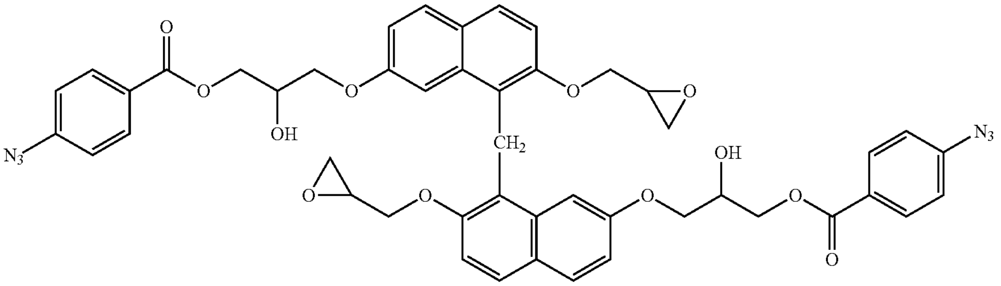

Preparation Example 1

To 4.19 g of the resin solution obtained in Synthesis Example 1 (solid content is 25.02% by mass), 0.001 g of a surfactant (product name: Megafac [trade name] R-40, fluorine-based surfactant, manufactured by DIC Corporation), 6.62 g of propylene glycol monomethyl ether, and 4.19 g of propylene glycol monomethyl ether acetate were added to prepare the solution of a stepped substrate coating composition.

Preparation Example 2

To 8.51 g of the resin solution obtained in Synthesis Example 2 (solid content is 24.64% by mass), 0.002 g of a surfactant (product name: Megafac [trade name] R-40, fluorine-based surfactant, manufactured by DIC Corporation), 13.11 g of propylene glycol monomethyl ether, and 8.37 g of propylene glycol monomethyl ether acetate were added to prepare the solution of a stepped substrate coating composition.

Preparation Example 3

To 8.09 g of the resin solution obtained in Synthesis Example 3 (solid content is 25.94% by mass), 0.002 g of a surfactant (product name: Megafac [trade name] R-40, fluorine-based surfactant, manufactured by DIC Corporation), 13.54 g of propylene glycol monomethyl ether, and 8.37 g of propylene glycol monomethyl ether acetate were added to prepare the solution of a stepped substrate coating composition.

Preparation Example 4

To 8.01 g of the resin solution obtained in Synthesis Example 4 (solid content is 24.78% by mass), 0.002 g of a surfactant (product name: Megafac [trade name] R-40, fluorine-based surfactant, manufactured by DIC Corporation), 13.62 g of propylene glycol monomethyl ether, and 8.37 g of propylene glycol monomethyl ether acetate were added to prepare the solution of a stepped substrate coating composition.

Preparation Example 5

To 8.47 g of the resin solution obtained in Synthesis Example 5 (solid content is 24.64% by mass), 0.002 g of a surfactant (product name: Megafac [trade name] R-40, fluorine-based surfactant, manufactured by DIC Corporation), 13.16 g of propylene glycol monomethyl ether, and 8.37 g of propylene glycol monomethyl ether acetate were added to prepare the solution of a stepped substrate coating composition.

Preparation Example 6

To 4.16 g of the resin solution obtained in Synthesis Example 6 (solid content is 25.24% by mass), 0.001 g of a surfactant (product name: Megafac [trade name] R-40, fluorine-based surfactant, manufactured by DIC Corporation), 6.66 g of propylene glycol monomethyl ether, and 4.19 g of propylene glycol monomethyl ether acetate were added to prepare the solution of a stepped substrate coating composition.

Preparation Example 7

To 7.64 g of the resin solution obtained in Synthesis Example 7 (solid content is 27.45% by mass), 0.002 g of a surfactant (product name: Megafac [trade name] R-40, fluorine-based surfactant, manufactured by DIC Corporation), 13.99 g of propylene glycol monomethyl ether, and 8.37 g of propylene glycol monomethyl ether acetate were added to prepare the solution of a stepped substrate coating composition.

Preparation Example 8

To 8.00 g of the resin solution obtained in Synthesis Example 8 (solid content is 26.24% by mass), 0.002 g of a surfactant (product name: Megafac [trade name] R-40, fluorine-based surfactant, manufactured by DIC Corporation), 13.63 g of propylene glycol monomethyl ether, and 8.37 g of propylene glycol monomethyl ether acetate were added to prepare the solution of a stepped substrate coating composition.

Preparation Example 9

To 7.60 g of the resin solution obtained in Synthesis Example 9 (solid content is 27.61% by mass), 0.002 g of a surfactant (product name: Megafac [trade name] R-40, fluorine-based surfactant, manufactured by DIC Corporation), 14.03 g of propylene glycol monomethyl ether, and 8.37 g of propylene glycol monomethyl ether acetate were added to prepare the solution of a stepped substrate coating composition.

Preparation Example 10

To 8.26 g of the resin solution obtained in Synthesis Example 10 (solid content is 25.39% by mass), 0.002 g of a surfactant (product name: Megafac [trade name] R-40, fluorine-based surfactant, manufactured by DIC Corporation), 13.37 g of propylene glycol monomethyl ether, and 8.37 g of propylene glycol monomethyl ether acetate were added to prepare the solution of a stepped substrate coating composition.

Preparation Example 11

To 6.80 g of the resin solution obtained in Synthesis Example 11 (solid content is 25.71% by mass), 0.002 g of a surfactant (product name: Megafac [trade name] R-40, fluorine-based surfactant, manufactured by DIC Corporation), 11.22 g of propylene glycol monomethyl ether, and 6.98 g of propylene glycol monomethyl ether acetate were added to prepare the solution of a stepped substrate coating composition.

Preparation Example 12

To 8.13 g of the resin solution obtained in Synthesis Example 12 (solid content is 25.80% by mass), 0.002 g of a surfactant (product name: Megafac [trade name] R-40, fluorine-based surfactant, manufactured by DIC Corporation), 13.50 g of propylene glycol monomethyl ether, and 8.37 g of propylene glycol monomethyl ether acetate were added to prepare the solution of a stepped substrate coating composition.

Preparation Example 13

To 9.44 g of the resin solution obtained in Synthesis Example 13 (solid content is 22.23% by mass), 0.002 g of a surfactant (product name: Megafac [trade name] R-40, fluorine-based surfactant, manufactured by DIC Corporation), 19.53 g of propylene glycol monomethyl ether, and 1.03 g of propylene glycol monomethyl ether acetate were added to prepare the solution of a stepped substrate coating composition.

Preparation Example 14

To 10.21 g of the resin solution obtained in Synthesis Example 14 (solid content is 20.54% by mass), 0.002 g of a surfactant (product name: Megafac [trade name] R-40, fluorine-based surfactant, manufactured by DIC Corporation), 19.53 g of propylene glycol monomethyl ether, and 0.25 g of propylene glycol monomethyl ether acetate were added to prepare the solution of a stepped substrate coating composition.

Preparation Example 15

To 8.22 g of the resin solution obtained in Synthesis Example 15 (solid content is 21.27% by mass), 0.002 g of a surfactant (product name: Megafac [trade name] R-40, fluorine-based surfactant, manufactured by DIC Corporation), 9.80 g of propylene glycol monomethyl ether, and 6.98 g of propylene glycol monomethyl ether acetate were added to prepare the solution of a stepped substrate coating composition.

Preparation Example 16

To 8.26 g of the resin solution obtained in Synthesis Example 16 (solid content is 21.16% by mass), 0.002 g of a surfactant (product name: Megafac [trade name] R-40, fluorine-based surfactant, manufactured by DIC Corporation), 9.76 g of propylene glycol monomethyl ether, and 6.98 g of propylene glycol monomethyl ether acetate were added to prepare the solution of a stepped substrate coating composition.

Preparation Example 17

To 10.73 g of the resin solution obtained in Synthesis Example 17 (solid content is 19.59% by mass), 0.002 g of a surfactant (product name: Megafac [trade name] R-40, fluorine-based surfactant, manufactured by DIC Corporation), 10.90 g of propylene glycol monomethyl ether, and 8.37 g of propylene glycol monomethyl ether acetate were added to prepare the solution of a stepped substrate coating composition.

Preparation Example 18

To 21.28 g of the resin solution obtained in Synthesis Example 18 (solid content is 16.90% by mass), 0.004 g of a surfactant (product name: Megafac [trade name] R-40, fluorine-based surfactant, manufactured by DIC Corporation), 51.42 g of propylene glycol monomethyl ether, and 7.28 g of propylene glycol monomethyl ether acetate were added to prepare the solution of a stepped substrate coating composition.

Preparation Example 19

To 7.72 g of the resin solution obtained in Synthesis Example 19 (solid content is 22.65% by mass), 0.002 g of a surfactant (product name: Megafac [trade name] R-40, fluorine-based surfactant, manufactured by DIC Corporation), 10.30 g of propylene glycol monomethyl ether, and 6.98 g of propylene glycol monomethyl ether acetate were added to prepare the solution of a stepped substrate coating composition.

Preparation Example 20

To 5.00 g of the propylene glycol monomethyl ether solution of the resin obtained in Synthesis Example 20 (solid content is 21.77% by mass), 0.11 g of a propylene glycol monomethyl ether acetate solution containing 1% by weight of a surfactant (product name: Megafac [trade name] R-40, fluorine-based surfactant, manufactured by DIC Corporation), 3.65 g of propylene glycol monomethyl ether acetate, and 4.86 g of propylene glycol monomethyl ether were added to prepare the solution of a stepped substrate coating composition.

Preparation Example 21

To 5.00 g of the propylene glycol monomethyl ether solution of the resin obtained in Synthesis Example 21 (solid content is 24.04% by mass), 0.12 g of a propylene glycol monomethyl ether acetate solution containing 1% by weight of a surfactant (product name: Megafac [trade name] R-40, fluorine-based surfactant, manufactured by DIC Corporation), 4.03 g of propylene glycol monomethyl ether acetate, and 5.89 g of propylene glycol monomethyl ether were added to prepare the solution of a stepped substrate coating composition.

Preparation Example 22

To 5.00 g of the propylene glycol monomethyl ether solution of the resin obtained in Synthesis Example 22 (solid content is 20.62% by mass), 0.10 g of a propylene glycol monomethyl ether acetate solution containing 1% by weight of a surfactant (product name: Megafac [trade name] R-40, fluorine-based surfactant, manufactured by DIC Corporation), 3.46 g of propylene glycol monomethyl ether acetate, and 4.34 g of propylene glycol monomethyl ether were added to prepare the solution of a stepped substrate coating composition.

Preparation Example 23

To 10.58 g of the resin solution obtained in Synthesis Example 23 (solid content is 19.82% by mass), 0.021 g of a surfactant (product name: Megafac [trade name] R-30N, fluorine-based surfactant, manufactured by DIC Corporation), 5.46 g of cyclohexanone, and 13.95 g of propylene glycol monomethyl ether were added to prepare the solution of a stepped substrate coating composition.

Preparation Example 24

To 12.93 g of the resin solution obtained in Synthesis Example 24 (solid content is 16.22% by mass), 0.021 g of a surfactant (product name: Megafac [trade name] R-30N, fluorine-based surfactant, manufactured by DIC Corporation), 3.11 g of cyclohexanone, and 13.95 g of propylene glycol monomethyl ether were added to prepare the solution of a stepped substrate coating composition.

Comparative Preparation Example 1

To 8.21 g of the resin solution obtained in Comparative Synthesis Example 1 (solid content is 25.55% by mass), 0.002 g of a surfactant (product name: Megafac [trade name] R-40, fluorine-based surfactant, manufactured by DIC Corporation), 13.42 g of propylene glycol monomethyl ether, and 8.37 g of propylene glycol monomethyl ether acetate were added to prepare the solution of a stepped substrate coating composition.

Comparative Preparation Example 2

To 7.83 g of the resin solution obtained in Comparative Synthesis Example 2 (solid content is 26.80% by mass), 0.002 g of a surfactant (product name: Megafac [trade name] R-40, fluorine-based surfactant, manufactured by DIC Corporation), 13.80 g of propylene glycol monomethyl ether, and 8.37 g of propylene glycol monomethyl ether acetate were added to prepare the solution of a stepped substrate coating composition.

Comparative Preparation Example 3

To 7.56 g of the resin solution obtained in Comparative Synthesis Example 3 (solid content is 27.76% by mass), 0.002 g of a surfactant (product name: Megafac [trade name] R-40, fluorine-based surfactant, manufactured by DIC Corporation), 14.07 g of propylene glycol monomethyl ether, and 8.37 g of propylene glycol monomethyl ether acetate were added to prepare the solution of a stepped substrate coating composition.

Comparative Preparation Example 4

To 2.61 g of the resin solution obtained in Comparative Synthesis Example 4 (solid content is 26.80% by mass), 0.001 g of a surfactant (product name: Megafac [trade name] R-40, fluorine-based surfactant, manufactured by DIC Corporation), 4.60 g of propylene glycol monomethyl ether, and 2.79 g of propylene glycol monomethyl ether acetate were added to prepare the solution of a stepped substrate coating composition.

Comparative Preparation Example 5

To 5.15 g of the resin solution obtained in Comparative Synthesis Example 5 (solid content is 23.17% by mass), 0.30 g of tetramethoxymethylglycoluril (product name: POWDERLINK [registered trademark] 1174, manufactured by Nihon Cytec Industries Inc.), 0.01 g of pyridinium p-toluenesulfonate, 0.001 g of a surfactant (product name: Megafac [trade name] R-40, fluorine-based surfactant, manufactured by DIC Corporation), 11.76 g of propylene glycol monomethyl ether, and 2.78 g of propylene glycol monomethyl ether acetate were added to prepare the solution of a stepped substrate coating composition.

Comparative Preparation Example 6

To 7.56 g of the propylene glycol monomethyl ether solution of tris(2-acryloyloxyethyl) isocyanurate (manufactured by Tokyo Chemical Industry Co., Formula (F-9)) (solid content is 23.13% by mass), 0.002 g of a surfactant (product name: Megafac [trade name] R-40, fluorine-based surfactant, manufactured by DIC Corporation), 10.46 g of propylene glycol monomethyl ether, and 6.98 g of propylene glycol monomethyl ether acetate were added to prepare the solution of a stepped substrate coating composition.

Formula (F-9)

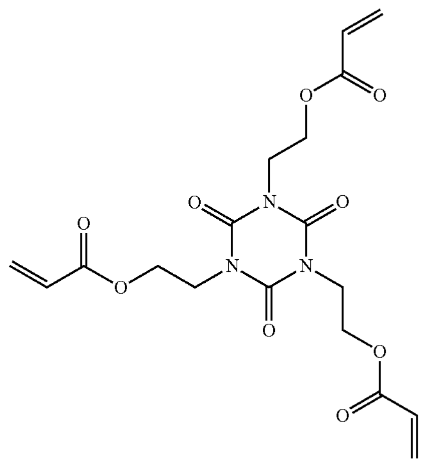

Comparative Preparation Example 7

To 5.00 g of the propylene glycol monomethyl ether solution of the resin obtained in Comparative Synthesis Example 6 (solid content is 25.47% by mass), 0.13 g of a propylene glycol monomethyl ether acetate solution containing 1% by weight of a surfactant (product name: Megafac [trade name] R-40, fluorine-based surfactant, manufactured by DIC Corporation), 4.27 g of propylene glycol monomethyl ether acetate, and 6.54 g of propylene glycol monomethyl ether were added to prepare the solution of a stepped substrate coating composition.

Comparative Preparation Example 8

To 5.00 g of the propylene glycol monomethyl ether solution of the resin obtained in Comparative Synthesis Example 7 (solid content is 23.70% by mass), 0.12 g of a propylene glycol monomethyl ether acetate solution containing 1% by weight of a surfactant (product name: Megafac [trade name] R-40, fluorine-based surfactant, manufactured by DIC Corporation), 3.98 g of propylene glycol monomethyl ether acetate, and 5.73 g of propylene glycol monomethyl ether were added to prepare the solution of a stepped substrate coating composition.

Comparative Preparation Example 9

To 5.00 g of the propylene glycol monomethyl ether solution of the resin obtained in Comparative Synthesis Example 8 (solid content is 19.51% by mass), 0.10 g of a propylene glycol monomethyl ether acetate solution containing 1% by weight of a surfactant (product name: Megafac [trade name] R-40, fluorine-based surfactant, manufactured by DIC Corporation), 3.27 g of propylene glycol monomethyl ether acetate, and 3.84 g of propylene glycol monomethyl ether were added to prepare the solution of a stepped substrate coating composition.

Comparative Preparation Example 10

To 3.00 g of pentaerythritol triacrylate (manufactured by Sigma-Aldrich Japan, Formula (F-10)), 0.003 g of a surfactant (product name: Megafac [trade name] R-40, fluorine-based surfactant, manufactured by DIC Corporation), 18.90 g of propylene glycol monomethyl ether, and 8.10 g of propylene glycol monomethyl ether acetate were added to prepare the solution of a stepped substrate coating composition.

Formula (F-10)

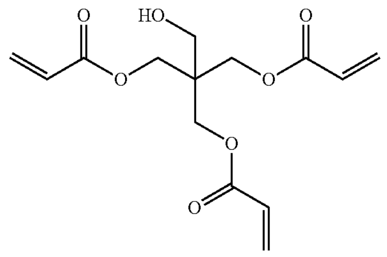

[Photocuring Property Test]

In Example 1 to Example 23, the stepped substrate coating compositions prepared in Preparation Example 1 to Preparation Example 18 and Preparation Example 20 to Preparation Example 24 each were applied (spin-coated) on a silicon wafer using a spinner. The applied composition was heated on a hot plate at 215° C. for 1 minute to form a coated film (resist underlayer film). In Example 18, the thickness of the applied stepped substrate coating composition prepared in Preparation Example 18 was adjusted to 100 nm. In Example 12 and Example 14, the applied stepped substrate coating compositions prepared in Preparation Example 12 and Preparation Example 14 were heated on a hot plate at 170° C. for 1 minute. In Example 21, the applied stepped substrate coating composition prepared in Preparation Example 22 was heated on a hot plate at 100° C. for 1 minute. In Example 22, the applied stepped substrate coating composition prepared in Preparation Example 23 was heated on a hot plate at 150° C. for 1 minute.

These stepped substrate coated films were irradiated with ultraviolet rays at 500 mJ/cm$^2$ by an ultraviolet irradiation apparatus using a UV irradiation unit (wavelength: 172 nm) equipped with ACT-12 manufactured by Tokyo Electron Limited and solvent exfoliation property after light irradiation (ultraviolet irradiation) was checked. As the solvent exfoliation property, the film thickness was measured in a manner that the coating film after the ultraviolet irradiation was immersed in a mixed solvent of propylene glycol monomethyl ether and propylene glycol monomethyl ether acetate in a ratio of 7:3 for 1 minute and the immersed coating film was baked at 100° C. for 1 minute after spin drying.

In Comparative Example 1 to Comparative Example 20, the applied stepped substrate coating compositions obtained in Preparation Example 1 to Preparation Example 18 and Preparation Example 23 and Preparation Example 24 each were spin-coated in a similar manner to the above test on a silicon wafer and heated. Thereafter, solvent exfoliation property was tested without subsequent light irradiation (ultraviolet irradiation).

In Comparative Example 21 to Comparative Example 27, the stepped substrate coating compositions obtained in Comparative Preparation Example 1 to Comparative Preparation Example 4 and Comparative Preparation Example 7 to Comparative Preparation Example 9 each were spin-coated in a similar manner to the above test on a silicon wafer and heated. Thereafter, the solvent exfoliation property was tested after light irradiation. The results are listed in Tables. In Tables, "Initial thickness" refers to a thickness before the solvent exfoliation property test.

TABLE 1

| Example | Light irradiation | Baking temperature (° C.) | Initial film thickness (nm) | Film thickness after solvent exfoliation (nm) |
|---|---|---|---|---|
| Example 1 | Irradiated | 215 | 198.3 | 197.5 |
| Example 2 | Irradiated | 215 | 196.8 | 195.8 |
| Example 3 | Irradiated | 215 | 190.7 | 189.3 |
| Example 4 | Irradiated | 215 | 197.6 | 196.8 |
| Example 5 | Irradiated | 215 | 193.6 | 192.6 |
| Example 6 | Irradiated | 215 | 186.6 | 185.7 |
| Example 7 | Irradiated | 215 | 193.0 | 192.0 |
| Example 8 | Irradiated | 215 | 198.4 | 197.5 |
| Example 9 | Irradiated | 215 | 196.3 | 195.2 |
| Example 10 | Irradiated | 215 | 195.5 | 194.9 |

TABLE 2

| Example | Light irradiation | Baking temperature (° C.) | Initial film thickness (nm) | Film thickness after solvent exfoliation (nm) |
|---|---|---|---|---|
| Example 11 | Irradiated | 215 | 195.3 | 194.3 |
| Example 12 | Irradiated | 170 | 197.1 | 196.1 |
| Example 13 | Irradiated | 215 | 190.4 | 189.7 |
| Example 14 | Irradiated | 170 | 188.7 | 188.3 |
| Example 15 | Irradiated | 215 | 192.4 | 191.3 |
| Example 16 | Irradiated | 215 | 191.4 | 190.8 |
| Example 17 | Irradiated | 215 | 211.1 | 211.0 |
| Example 18 | Irradiated | 215 | 86.6 | 42.6 |
| Example 19 | Irradiated | 215 | 270.8 | 269.6 |
| Example 20 | Irradiated | 215 | 282.6 | 276.6 |

TABLE 2-continued

| Example | Light irradiation | Baking temperature (° C.) | Initial film thickness (nm) | Film thickness after solvent exfoliation (nm) |
|---|---|---|---|---|
| Example 21 | Irradiated | 100 | 280.1 | 275.6 |
| Example 22 | Irradiated | 150 | 172.3 | 171.3 |
| Example 23 | Irradiated | 215 | 192.2 | 176.8 |

TABLE 3

| Comparative Example | Light irradiation | Baking temperature (° C.) | Initial film thickness (nm) | Film thickness after solvent exfoliation (nm) |
|---|---|---|---|---|
| Comparative Example 1 | Not irradiated | 215 | 215.8 | 11.3 |
| Comparative Example 2 | Not irradiated | 215 | 198.2 | 10.5 |
| Comparative Example 3 | Not irradiated | 215 | 200.1 | 10.5 |
| Comparative Example 4 | Not irradiated | 215 | 202.2 | 11.1 |
| Comparative Example 5 | Not irradiated | 215 | 196.9 | 10.8 |
| Comparative Example 6 | Not irradiated | 215 | 200.5 | 11.5 |
| Comparative Example 7 | Not irradiated | 215 | 202.5 | 11.1 |
| Comparative Example 8 | Not irradiated | 215 | 200.7 | 10.3 |
| Comparative Example 9 | Not irradiated | 215 | 200.8 | 11.3 |

TABLE 4

| Comparative Example | Light irradiation | Baking temperature (° C.) | Initial film thickness (nm) | Film thickness after solvent exfoliation (nm) |
|---|---|---|---|---|
| Comparative Example 10 | Not irradiated | 215 | 200.7 | 33.1 |
| Comparative Example 11 | Not irradiated | 215 | 199.0 | 10.2 |
| Comparative Example 12 | Not irradiated | 170 | 198.1 | 10.3 |
| Comparative Example 13 | Not irradiated | 215 | 202.6 | 2.5 |
| Comparative Example 14 | Not irradiated | 170 | 201.4 | 3.3 |
| Comparative Example 15 | Not irradiated | 215 | 199.4 | 10.6 |
| Comparative Example 16 | Not irradiated | 215 | 199.7 | 10.5 |
| Comparative Example 17 | Not irradiated | 215 | 202.2 | 3.2 |
| Comparative Example 18 | Not irradiated | 215 | 202.6 | 6.9 |
| Comparative Example 19 | Not irradiated | 215 | 172.4 | 5.0 or smaller |
| Comparative Example 20 | Not irradiated | 215 | 191.6 | 5.0 or smaller |
| Comparative Example 21 | Irradiated | 215 | 195.9 | 11.6 |
| Comparative Example 22 | Irradiated | 215 | 192.7 | 6.6 |
| Comparative Example 23 | Irradiated | 215 | 197.5 | 15.5 |
| Comparative Example 24 | Irradiated | 215 | 198.2 | 6.7 |
| Comparative Example 25 | Irradiated | 215 | 2783 | 360 |

TABLE 4-continued

| Comparative Example | Light irradiation | Baking temperature (° C.) | Initial film thickness (nm) | Film thickness after solvent exfoliation (nm) |
|---|---|---|---|---|
| Comparative Example 26 | Irradiated | 215 | 2813 | 12 |
| Comparative Example 27 | Irradiated | 100 | 2618 | 193 |

From the results, it was confirmed that Example 1 to Example 17 and Example 19 to Example 23 were not cured by heating before the irradiation with ultraviolet rays but cured by the ultraviolet irradiation.

In Example 18, it was confirmed that the coated film was cured by about half by the ultraviolet irradiation.

In Comparative Example 21 to Comparative Example 27, it was confirmed that the coated films were not cured by the ultraviolet irradiation.

[Evaluation Tests of Optical Constants and Etching Rate]

As Example 1 to Example 13, Example 17, and Example 19 to Example 21, the stepped substrate coating compositions prepared in Preparation Example 1 to Preparation Example 13, Preparation Example 17, and Preparation Example 20 to Preparation Example 22 each were applied on a silicon wafer and heated on a hot plate at 215° C. for 1 minute to form the stepped substrate coating compositions. The refractive indexes and attenuation coefficients at 193 nm of the stepped substrate coating compositions were measured. In Examples 12 and 13, the applied stepped substrate coating compositions prepared in Preparation Example 12 and Preparation Example 13 were heated on a hot plate at 170° C. for 1 minute. As Example 21, the stepped substrate coating composition prepared in Preparation Example 22 was heated on a hot plate at 100° C. for 1 minute. Ellipsometer (VUV-VASE) manufactured by J. A. Woollam Japan Corp. was used for the measurement of the refractive index and the attenuation coefficient.

As Example 1 to Example 13, Example 17, and Example 19 to Example 21, the stepped substrate coating compositions prepared in Preparation Example 1 to Preparation Example 13, Preparation Example 17, and Preparation Example 20 to Preparation Example 22 each were applied on a silicon wafer and the dry etching rates of the stepped substrate coating composition formed by heating on a hot plate at 215° C. for 1 minute and the resist film obtained from resist solution (product name: Sumiresist PAR855) manufactured by Sumitomo Chemical Corporation were compared with each other. In Example 12 and Example 13, the applied stepped substrate coating compositions prepared in Preparation Example 12 and Preparation Example 13 were heated on a hot plate at 170° C. for 1 minute. In Example 21, the applied stepped substrate coating composition prepared in Preparation Example 22 was heated on a hot plate at 100° C. for 1 minute. For the dry etching rate measurement, a dry etching apparatus (RIE-10NR) manufactured by Samco Inc. was used and the dry etching rate to $CF_4$ gas was measured.

The refractive index (n value), the attenuation coefficient (k value), and the ratio of dry etching rate (selection ratio of dry etching rate) of the stepped substrate coated film (planarization film) were listed in Table 5.

TABLE 5

| Sample | Wavelength | Refractive index (n value) | Attenuation coefficient (k value) | Selection ratio of etching rate |
|---|---|---|---|---|
| Example 1 | 193 nm | 1.49 | 0.29 | 1.10 |
| Example 2 | 193 nm | 1.49 | 0.56 | 0.96 |
| Example 3 | 193 nm | 1.51 | 0.63 | 1.09 |
| Example 4 | 193 nm | 1.47 | 0.58 | 0.99 |
| Example 5 | 193 nm | 1.43 | 0.45 | 0.96 |
| Example 6 | 193 nm | 1.47 | 0.19 | 1.07 |
| Example 7 | 193 nm | 1.51 | 0.18 | 1.22 |
| Example 8 | 193 nm | 1.90 | 0.37 | 1.22 |
| Example 9 | 193 nm | 1.47 | 0.14 | 1.05 |
| Example 10 | 193 nm | 1.48 | 0.36 | 1.09 |
| Example 11 | 193 nm | 1.51 | 0.39 | 1.15 |
| Example 12 | 193 nm | 1.51 | 0.45 | 1.08 |
| Example 13 | 193 nm | 1.50 | 0.45 | 1.08 |
| Example 17 | 193 nm | 1.52 | 0.32 | 1.08 |
| Example 19 | 193 nm | 1.52 | 0.18 | 1.30 |
| Example 20 | 193 nm | 1.54 | 0.18 | 1.24 |
| Example 21 | 193 nm | 1.54 | 0.26 | 1.23 |

From the results of Table 5, the stepped substrate coated film (planarization film) formed from the stepped substrate coating composition of the present invention has an appropriate antireflection effect. The substrate can be processed because the stepped substrate coating film (planarization film) has a dry etching rate equal to or higher than that of the resist film when the resist film is applied onto the stepped substrate coated film (planarization film) formed from the stepped substrate coating composition of the present invention as an upper layer, exposed and developed to form a resist pattern, and thereafter the substrate is processed by dry-etching according to the resist pattern using an etching gas or the like.

Therefore, the stepped substrate coated film (planarization film) formed by applying and curing the stepped substrate coating composition of the present invention can be used as a resist underlayer film under the resist film, and thus the stepped substrate coating composition can be used as the resist underlayer film-forming composition.

[Planarization Property Test on Stepped Substrate]

As evaluation of a step coverage property, coated film thicknesses were compared in a dense pattern area (D-1) having a trench width of 50 nm and a pitch of 100 nm, an open area having no formed pattern, and a large trench areas having trench widths of 230 nm (T-1) and 800 nm (T-2) in a $SiO_2$ substrate having a film thickness of 200 nm. As the Example 1 to Example 18, the stepped substrate coating compositions prepared in Preparation Example 1 to Preparation Example 18 each were applied onto the substrate at a film thickness of 150 nm and the applied composition was baked at 215° C. for 60 seconds. Thereafter, the step coverage property of the baked sample was observed using a scanning electron microscope (S-4800) manufactured by Hitachi High-Technologies Corporation. The planarization property was evaluated by measuring the film thickness difference between the film thicknesses of the dense area and the large trench area and the film thickness in the open area. In Example 12 and Example 14, the applied stepped substrate coating compositions prepared in Preparation Example 12 and Preparation Example 14 were heated on a hot plate at 170° C. for 1 minute. The coverage properties of the thermosetting planarization films obtained from Comparative Preparation Example 5 and Comparative Preparation Example 10 as Comparative Example 28 and Comparative Example 30 were evaluated. In Comparative Example 28, the stepped substrate coating composition was applied onto the substrate with a thickness of 150 nm and baked at 215° C. for 60 seconds, whereas in Comparative Example 30, the stepped substrate coating composition was applied on the substrate with a film thickness of 150 DM and baked at 170° C. for 60 seconds. The measured film thicknesses are listed in Table 6.

TABLE 6

| Sample | Film thickness difference (nm) D-1/OPEN | Film thickness difference (nm) T-1/OPEN | Film thickness difference (nm) T-2/OPEN |
|---|---|---|---|
| Example 1 | 14 | 8 | 12 |
| Example 2 | 12 | 4 | 4 |
| Example 3 | 32 | 10 | 8 |
| Example 4 | 18 | 6 | 4 |
| Example 5 | 12 | 6 | 16 |
| Example 6 | 22 | 10 | 20 |
| Example 7 | 18 | 4 | 16 |
| Example 8 | 22 | 2 | 10 |
| Example 9 | 22 | 6 | 18 |
| Example 10 | 8 | 6 | 0 |
| Example 11 | 12 | 18 | 8 |
| Example 12 | 16 | 2 | 4 |
| Example 13 | 22 | 20 | 20 |
| Example 14 | 0 | 16 | 20 |
| Example 15 | 20 | 0 | 10 |
| Example 16 | 34 | 22 | 10 |
| Example 17 | 22 | 6 | 6 |
| Example 18 | 24 | 0 | 10 |
| Comparative Example 28 | 108 | 65 | 79 |
| Comparative Example 30 | Impossible to measure | Impossible to measure | Impossible to measure |

Comparison of the coverage property to the stepped substrate indicates that Example 1 to Example 18 have smaller film thickness differences between the pattern area and the open area than the film thickness differences of Comparative Example 28, which provides the excellent planarization property.

In Comparative Example 30, the film formability on the stepped substrate was not good and thus the film thickness difference between the film thicknesses of the dense area and the large trench area and the film thickness of the open area was not able to be calculated. In other words, the stepped substrate coating composition derived from the epoxy compound has a secondary hydroxy group and thus a high planarization property is exhibited on the stepped substrate.

[Film Formability Onto Substrate]

As Example 24, the film formability of the stepped substrate coating composition formed by applying the stepped substrate coating composition prepared in Preparation Example 19 onto a silicon wafer and heating the applied composition at 215° C. for 1 minute on a hot plate was determined by measuring the film thicknesses before and after heating. As Comparative Example 29, the film of the stepped substrate coating composition prepared in Comparative Preparation Example 6 was formed in a similar manner to the above procedure on a silicon wafer and the film formability thereof was determined. The results are listed in Table 7.

TABLE 7

| Sample | Film thickness before heating (nm) | Film thickness after heating (nm) |
|---|---|---|
| Example 24 | 208.1 | 195.0 |
| Comparative Example 29 | 210.3 | 21.5 |

Comparing the film formability, in Example 24, the applied stepped substrate coating composition was determined to be capable of being formed on a silicon wafer after heating, whereas, in Comparative Example 29, the applied stepped substrate coating composition was determined to be incapable of being formed on a silicon wafer after heating. In other words, it can be said that the stepped substrate coating composition derived from the epoxy compound has excellent film formability on a silicon wafer.

INDUSTRIAL APPLICABILITY

The stepped substrate coating composition of the present invention can be used as a stepped substrate coating composition for forming a coated film having planarization property capable of forming a coating film that has high filling property to a pattern and does not cause degasification or heat shrinkage.

The invention claimed is:

1. A photocurable stepped substrate coating composition comprising a compound (E) and a solvent (F), wherein the compound (E) is selected from the group consisting of:

Formula (E-1)

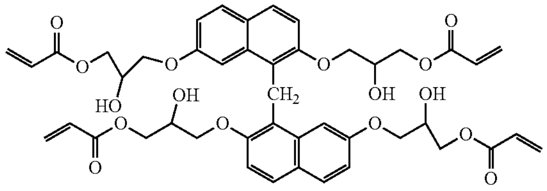

Formula (E-2)

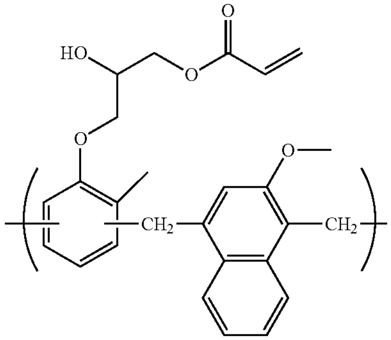

Formula (E-3)

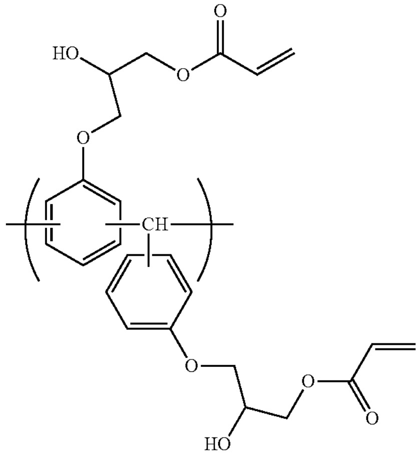

-continued

Formula (E-4)

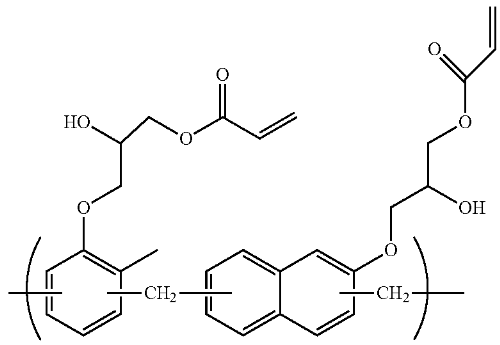

Formula (E-5)

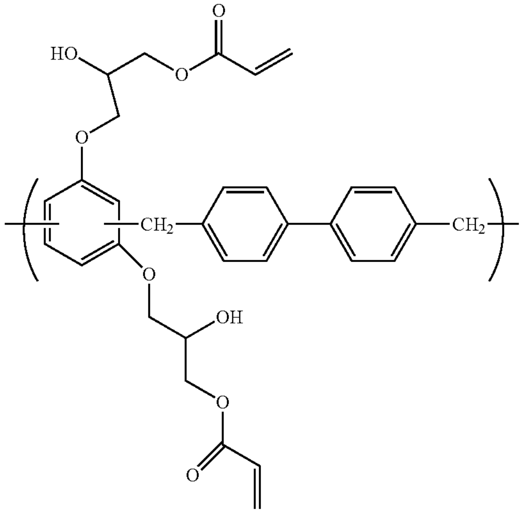

Formula (E-6)

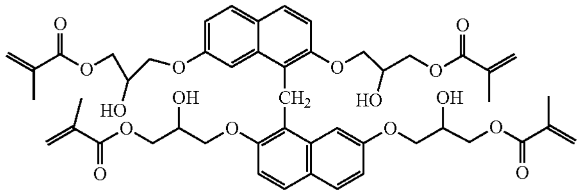

Formula (E-7)

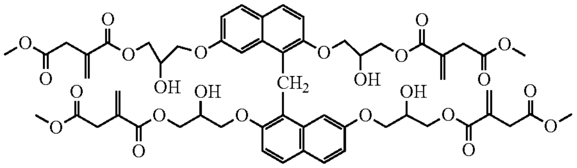

Formula (E-8)

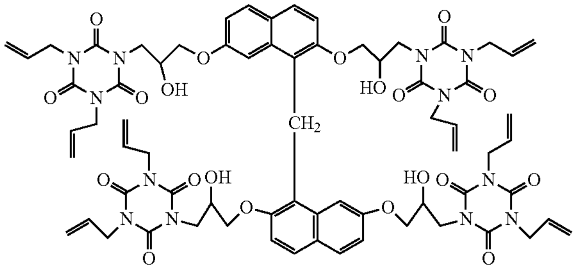

-continued
Formula (E-9)
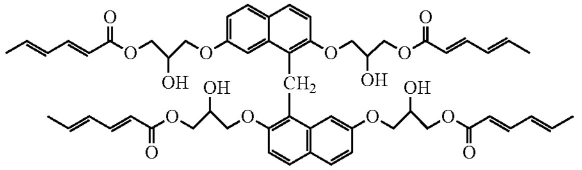
Formula (E-10)
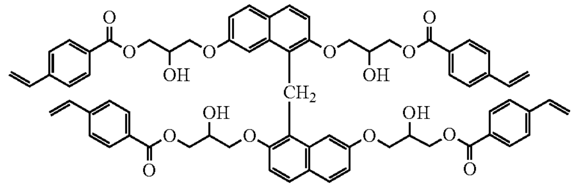
Formula (E-11)
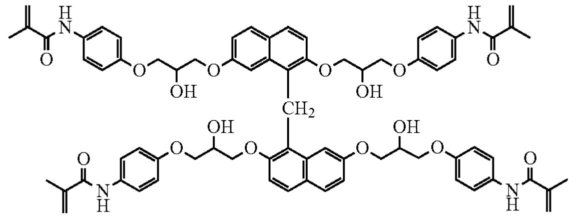
Formula (E-12)
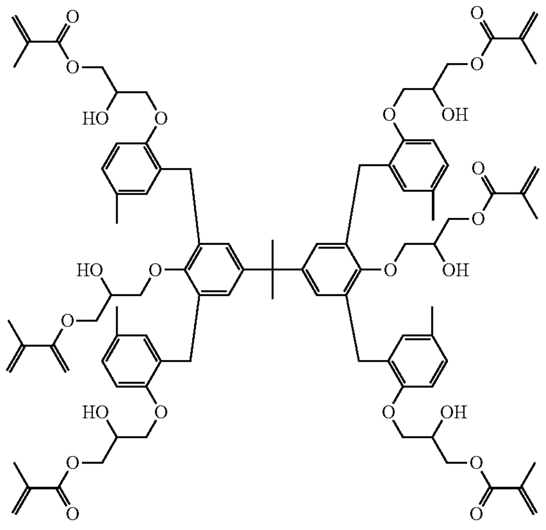
-continued
Formula (E-14)
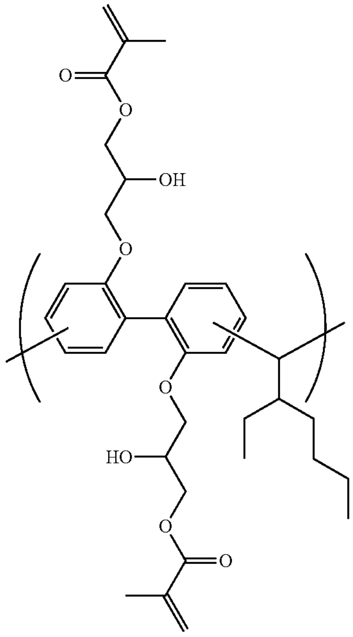
Formula (E-15)
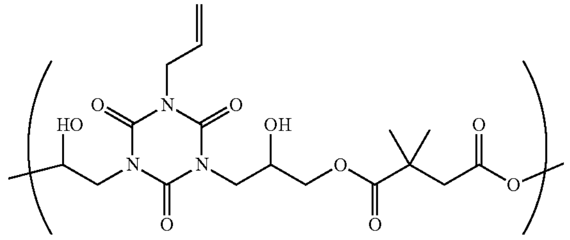
Formula (E-17)
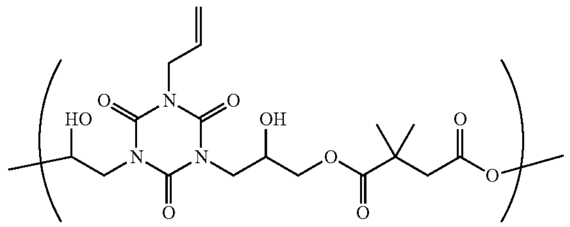
Unit structure (E-17-1)
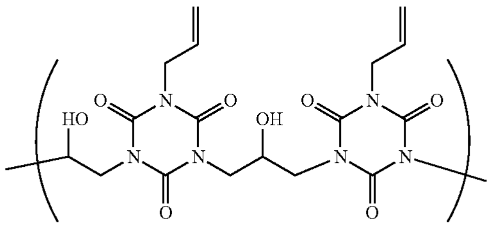
Unit structure (E-17-2)
Formula (E-18)
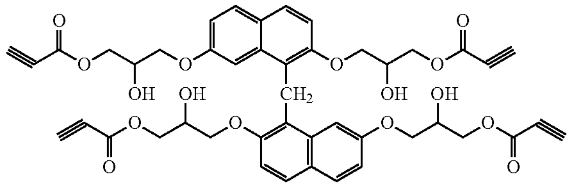

-continued

Formula (E-19)

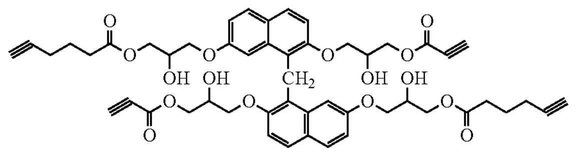

Formula (E-20)

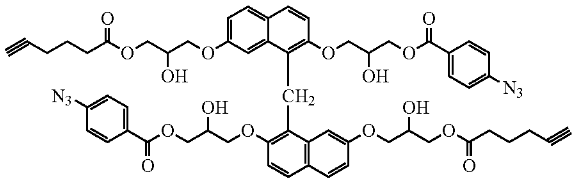

Formula (E-21)

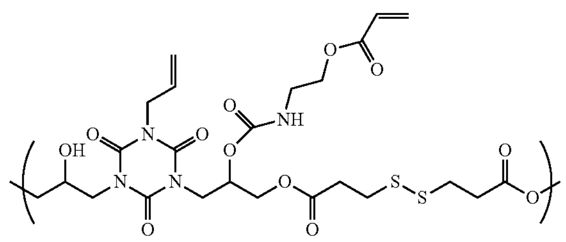

Formula (E-22)

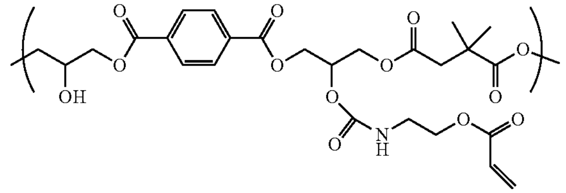

and when compound (E) has formula (E-17), the proportion of the unit structure (E-17-1) and the unit structure (E-17-2) is in a molar ratio of 60:40, wherein the coating composition does not contain an acid catalyst.

2. The photocurable stepped substrate coating composition according to claim 1, wherein the stepped substrate coating composition is a resist underlayer film-forming composition used in a lithography process for producing a semiconductor device.

3. A method for producing a coated substrate, the method comprising:

(i) applying the photocurable stepped substrate coating composition as claimed in claim 1 to a substrate having a step, and (ii) performing exposure of the applied composition to light, wherein Bias (coating step) between the open area and the pattern areas is 1 nm to 50 nm.

4. The method for producing a coated substrate according to claim 3, further comprising (ia) heating the applied composition at 70° C. to 400° C. for 10 seconds to 5 minutes after the step (i) of applying the photocurable stepped substrate coating composition.

5. The method for producing a coated substrate according to claim 3, wherein the exposure wavelength in the step (ii) is 150 nm to 248 nm.

6. The method for producing a coated substrate according to claim 3, wherein the exposure amount in the step (ii) is 10 $mJ/cm^2$ to 3,000 $mJ/cm^2$.

7. The method for producing a coated substrate according to claim 3, wherein the substrate has an open area (non-pattern area) and pattern areas of DENCE (dense) and ISO (coarse) and an aspect ratio of the pattern is 0.1 to 10.

8. A method for producing a semiconductor device, the method comprising:

forming an underlayer film using the stepped substrate coating composition as claimed in claim 1 on a substrate having a step;

forming a resist film thereon;

forming a resist pattern by irradiation with light or electron beams and development;

etching the underlayer film using the formed resist pattern; and processing the semiconductor substrate using the patterned underlayer film.

9. The method for producing a semiconductor device according to claim 8, wherein the substrate having a step is a substrate having an open area (non-pattern area) and pattern areas of DENCE (dense) and ISO (coarse) and having an aspect ratio of the pattern of 0.1 to 10.

10. The method for producing a semiconductor device according to claim 8, wherein the step of forming an underlayer film using the stepped substrate coating composition comprises (i) applying the photocurable stepped substrate coating composition to a substrate having a step, and (ii) performing exposure of the applied composition to light.

11. The method for producing a semiconductor device according to claim 10, further comprising (ia) heating the applied composition at 70° C. to 400° C. for 10 seconds to 5 minutes after the step (i) of applying the photocurable stepped substrate coating composition.

12. The method for producing a semiconductor device according to claim 10, wherein the exposure wavelength in the step (ii) is 150 nm to 248 nm.

13. The method for producing a semiconductor device according to claim 10, wherein the exposure amount in the step (ii) is 10 $mJ/cm^2$ to 3,000 $mJ/cm^2$.

14. The method for producing a semiconductor device according to claim 8, wherein the underlayer film obtained from the stepped substrate coating composition has a coating step of 1 nm to 50 nm.

15. A method for producing a semiconductor device, the method comprising:

forming an underlayer film using the photocurable stepped substrate coating composition as claimed in claim 1 on a substrate having a step;

forming a hard mask thereon;

further forming a resist film thereon;

forming a resist pattern by irradiation of light or electron beams and development;

etching the hard mask using the formed resist pattern;

etching the underlayer film using the patterned hard mask; and processing a semiconductor substrate using the patterned underlayer film.

16. The method for producing a semiconductor device according to claim 15, wherein the substrate having a step is a substrate having an open area (non-pattern area) and pattern areas of DENCE (dense) and ISO (coarse) and having an aspect ratio of the pattern of 0.1 to 10.

17. The method for producing a semiconductor device according to claim 15, wherein the step of forming an underlayer film using the stepped substrate coating composition comprises (i) applying the photocurable stepped substrate coating composition to a substrate having a step, and (ii) performing exposure of the applied composition to light.

18. The method for producing a semiconductor device according to claim 17, further comprising (ia) heating the applied composition at 70° C. to 400° C. for 10 seconds to 5 minutes after the step (i) of applying the photocurable stepped substrate coating composition.

19. The method for producing a semiconductor device according to claim 17, wherein the exposure wavelength in the step (ii) is 150 nm to 248 nm.

20. The method for producing a semiconductor device according to claim 17, wherein the exposure amount in the step (ii) is 10 $mJ/cm^2$ to 3,000 $mJ/cm^2$.

21. The method for producing a semiconductor device according to claim 15, wherein the underlayer film obtained from the stepped substrate coating composition has a coating step of 1 nm to 50 nm.

* * * * *